(12) United States Patent
Nakayama

(10) Patent No.: US 8,780,255 B2
(45) Date of Patent: *Jul. 15, 2014

(54) SOLID-STATE IMAGING DEVICE, MANUFACTURING METHOD THEREOF, AND ELECTRONIC APPARATUS

(71) Applicant: Sony Corporation, Tokyo (JP)

(72) Inventor: Hajime Nakayama, Kumamoto (JP)

(73) Assignee: Sony Corporation (JP)

( * ) Notice: Subject to any disclaimer, the term of this patent is extended or adjusted under 35 U.S.C. 154(b) by 4 days.

This patent is subject to a terminal disclaimer.

(21) Appl. No.: 13/758,033

(22) Filed: Feb. 4, 2013

(65) Prior Publication Data

US 2013/0141625 A1 Jun. 6, 2013

Related U.S. Application Data

(62) Division of application No. 12/660,211, filed on Feb. 23, 2010, now Pat. No. 8,395,692.

(30) Foreign Application Priority Data

Mar. 4, 2009 (JP) ................................. P2009-050771

(51) Int. Cl.
*H04N 5/225* (2006.01)
*H01L 23/053* (2006.01)
*H01L 27/00* (2006.01)

(52) U.S. Cl.
USPC .................. 348/340; 257/700; 250/208.1

(58) Field of Classification Search
USPC ............... 348/273, 294, 335, 340; 250/208.1; 257/700, 701

See application file for complete search history.

(56) References Cited

U.S. PATENT DOCUMENTS

2006/0278948 A1* 12/2006 Yamaguchi et al. .......... 257/444
2009/0008687 A1* 1/2009 Katsuno et al. ............... 257/292
2009/0026563 A1* 1/2009 Katsuno et al. ............... 257/432

FOREIGN PATENT DOCUMENTS

JP 2002 359363 A 12/2002
JP 2007-324481 A 12/2007

* cited by examiner

*Primary Examiner* — Trung Diep
(74) *Attorney, Agent, or Firm* — Lerner, David, Littenberg, Krumholz & Mentlik, LLP

(57) ABSTRACT

A solid-state imaging device includes: a plurality of photoelectric conversion units disposed on an imaging surface of a substrate; and a plurality of inner-layer lenses that are disposed in correspondence with each of the plurality of photoelectric conversion units on the upper side of the photoelectric conversion units and are formed in shapes protruding in directions toward the photoelectric conversion units, wherein each of the plurality of inner-layer lenses is formed to have different lens shapes in the center and in the periphery of the imaging surface.

4 Claims, 22 Drawing Sheets

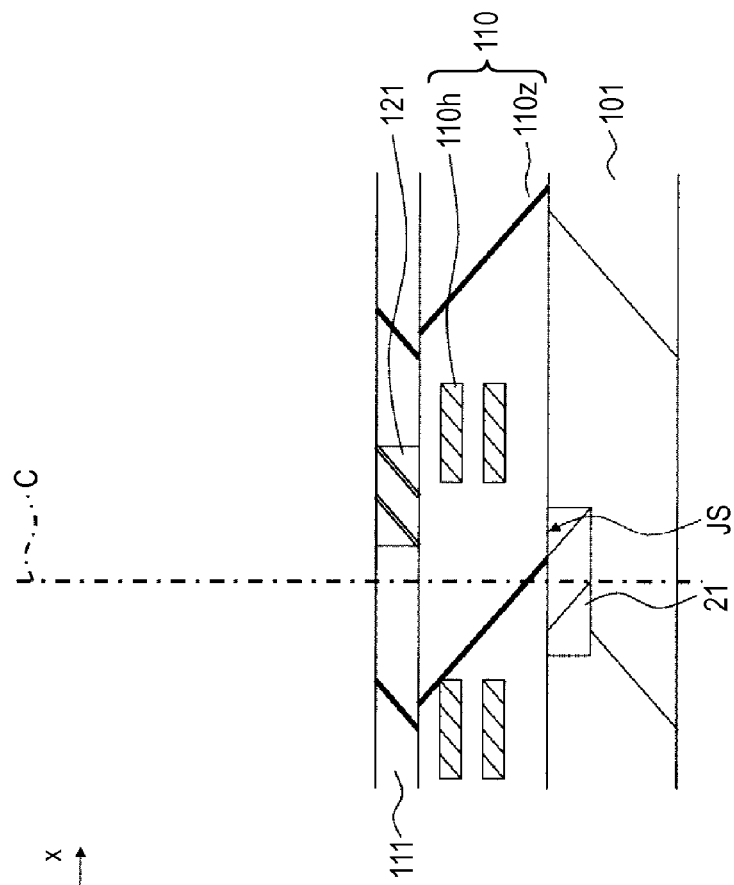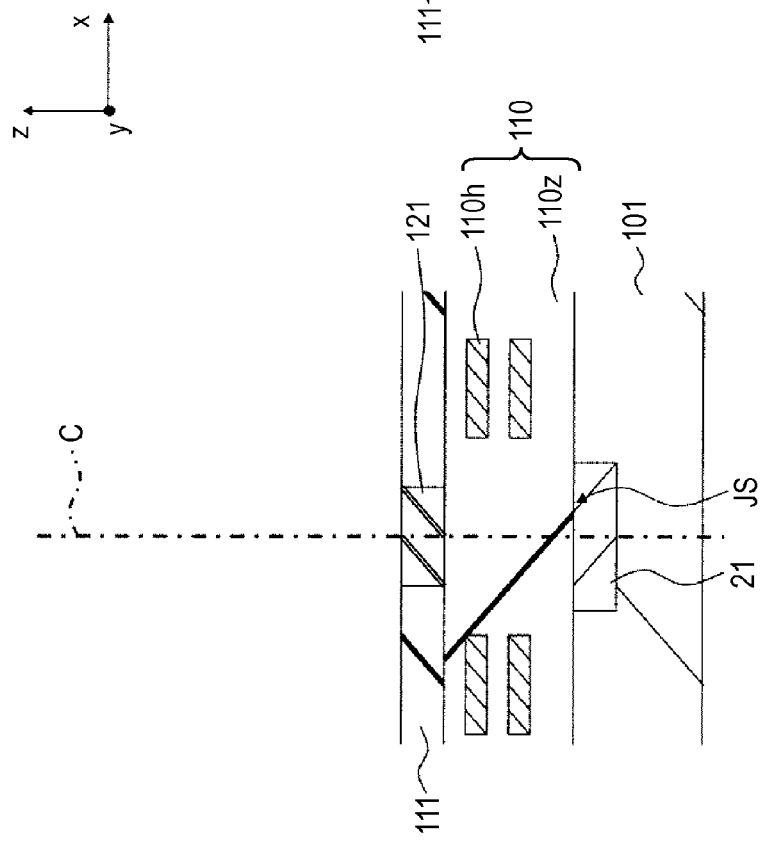

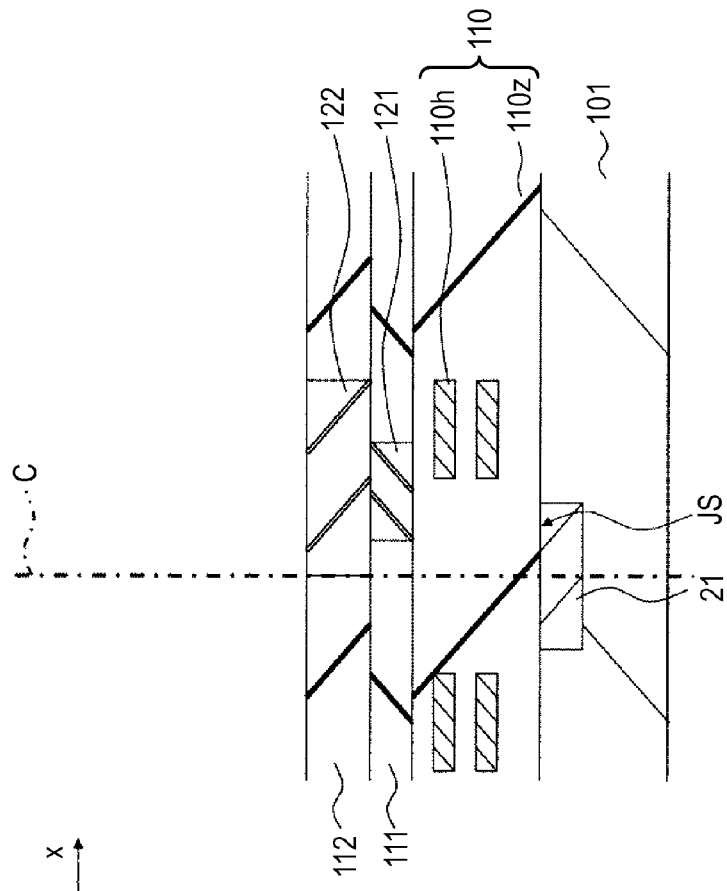
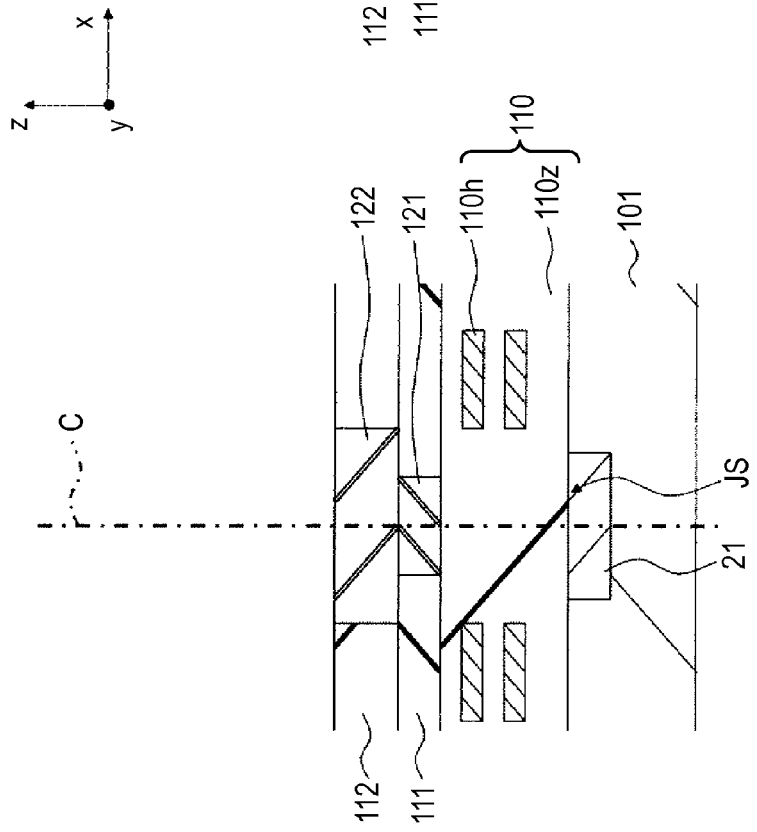

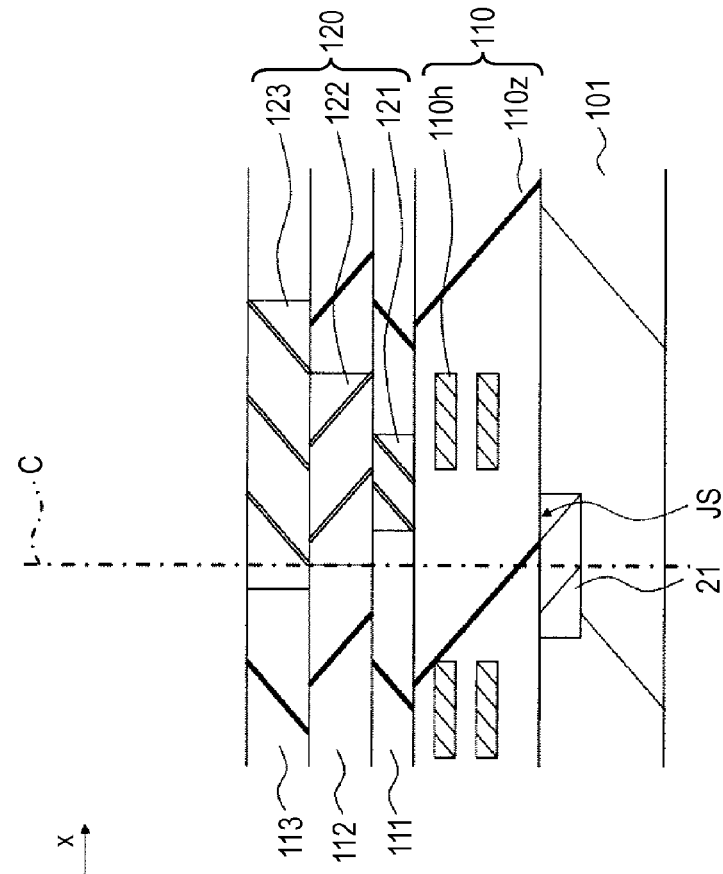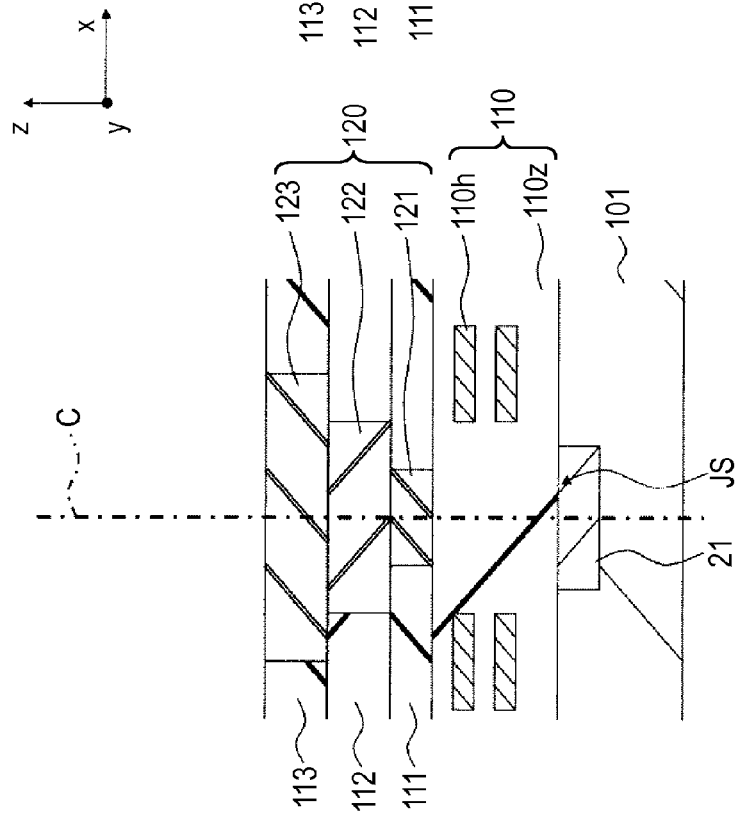

SOLID-STATE IMAGING DEVICE, MANUFACTURING METHOD THEREOF, AND ELECTRONIC APPARATUS

CROSS-REFERENCE TO RELATED APPLICATIONS

This application is a divisional of U.S. application Ser. No. 12/660,211, filed on Feb. 23, 2010, which claims priority from Japanese Patent Application No. 2009-050771, filed on Mar. 4, 2009 in the Japanese Patent Office, the disclosures of which are hereby incorporated by reference herein.

BACKGROUND OF THE INVENTION

1. Field of the Invention

The present invention relates to a solid-state imaging device, a manufacturing method thereof, and an electronic apparatus, and more particularly, to a solid-state imaging device in which a plurality of photoelectric conversion units are disposed on an imaging surface of a substrate, and a plurality of inner-layer lenses are formed in shapes protruding in directions toward the photoelectric conversion units, a manufacturing method thereof, and an electronic apparatus.

2. Description of the Related Art

Electronic apparatuses such as a digital video camera and a digital camera include solid-state imaging devices. For example, the solid-state imaging device includes a CMOS (Complementary Metal Oxide Semiconductor)-type image sensor and a CCD (Charge Coupled Device)-type image sensor.

In the solid-state imaging devices, an image forming area in which a plurality of pixels are formed is disposed on a surface of a semiconductor substrate. In each of the plurality of pixels, a photoelectric conversion unit that generates signal electric charges by receiving incident light through a curved lens and performing photoelectric conversion for the received light is disposed. For example, a photo diode is formed as the photoelectric conversion unit.

In the solid-state imaging device, for example, an on-chip lens is disposed on the upper side of the photoelectric conversion unit. A configuration in which an inner-layer lens is disposed between the photoelectric conversion unit and the on-chip lens has been proposed. The inner-layer lens is disposed for efficiently irradiating light that is incident through the on-chip lens onto the photoelectric conversion unit. For example, each of a plurality of inner-layer lenses are formed to have a downward convex structure protruding in directions toward the photoelectric conversion unit (for example, see JP-A-2002-359363 and JP-A-2007-324481).

SUMMARY OF THE INVENTION

In the solid-state imaging devices, the image quality of an image that is imaged may deteriorate due to angles of main light beams, which are received by pixels, differing in accordance with the position in the image forming area.

In particular, in a center portion of the image forming area, the angle of the main light beam incident through the curved lens is almost perpendicular to the image forming area. On the other hand, in the peripheral portion of the image forming area, the angle of the main light beam that is incident through the curved lens is tilted with respect to the direction perpendicular to the image forming area. Accordingly, there are cases where the center portion of the image that is imaged becomes a bright image, and a peripheral portion becomes a dark image, thereby deteriorating the image quality of the image that is imaged.

In other words, there is a difference between the sensitivities of the center portion and the peripheral portion of the image forming area, and accordingly, there are cases where the image quality of an image that is imaged deteriorates.

Accordingly, there is a need for providing a solid-state imaging device capable of improving the image quality of an image that is imaged, a manufacturing method thereof, and an electronic apparatus.

According to an embodiment of the present invention, there is provided a solid-state imaging device including: a plurality of photoelectric conversion units disposed on an imaging surface of a substrate; and a plurality of inner-layer lenses that are disposed in correspondence with each of the plurality of photoelectric conversion units on the upper side of the photoelectric conversion units and are formed in shapes protruding in directions toward the photoelectric conversion units. Each of the plurality of inner-layer lenses is formed to have different lens shapes in the center and the periphery of the imaging surface.

According to another embodiment of the present invention, there is provided an electronic apparatus including: a plurality of photoelectric conversion units disposed on an imaging surface of a substrate; and a plurality of inner-layer lenses that are disposed in correspondence with each of the plurality of photoelectric conversion units on the upper side of the photoelectric conversion units and are formed in shapes protruding in directions toward the photoelectric conversion units. Each of the plurality of inner-layer lenses is formed to have different lens shapes in the center and the periphery of the imaging surface.

According to another embodiment of the present invention, there is provided a method of manufacturing a solid-state imaging device. The method includes forming a plurality of inner-layer lenses in shapes protruding in directions toward a plurality of photoelectric conversion units on the upper side of the plurality of photoelectric conversion units so as to be in correspondence with each of the plurality of photoelectric conversion units disposed on an imaging surface of a substrate. In the forming of the plurality of inner-layer lenses, each of the plurality of inner-layer lenses is formed to have different lens shapes in the center and the periphery of the imaging surface.

According to an embodiment of the present invention, as described above, by forming the lens shape of each of the plurality of inner-layer lenses to be different in the center and in the periphery of the imaging surface, occurrence of a difference between the sensitivities of the center portion and the peripheral portion of the image forming area is prevented.

According to an embodiment of the present invention, a solid-state imaging device capable of improving the image quality of an image that is imaged, a manufacturing method thereof, and an electronic apparatus can be provided.

BRIEF DESCRIPTION OF THE DRAWINGS

FIGS. 8A and 8B are cross-sectional views representing major portions disposed in each process of a method of manufacturing a solid-state imaging device 1 according to Embodiment 1 of the present invention.

FIGS. 9A and 9B are cross-sectional views representing major portions disposed in each process of a method of manufacturing a solid-state imaging device 1 according to Embodiment 1 of the present invention.

FIGS. 10A and 10B are cross-sectional views representing major portions disposed in each process of a method of manufacturing a solid-state imaging device 1 according to Embodiment 1 of the present invention.

DESCRIPTION OF THE PREFERRED EMBODIMENTS

Hereinafter, embodiments of the present invention will be described with reference to the accompanying drawings.

Description will be made in the following order.

1. Embodiment 1
2. Embodiment 2 (a case where an inner-layer lens has a taper shape)
3. Embodiment 3 (a case where the refractive index of an inner-layer lens decreases toward photo diode)
4. Embodiment 4 (a case where the refractive index of an inner-layer lens increases toward photo diode)
5. Embodiment 5 (a case where an optical waveguide is included)
6. Others

1. Embodiment 1

Device Configuration (1) Configuration of Major Portion of Camera

Figure 1:
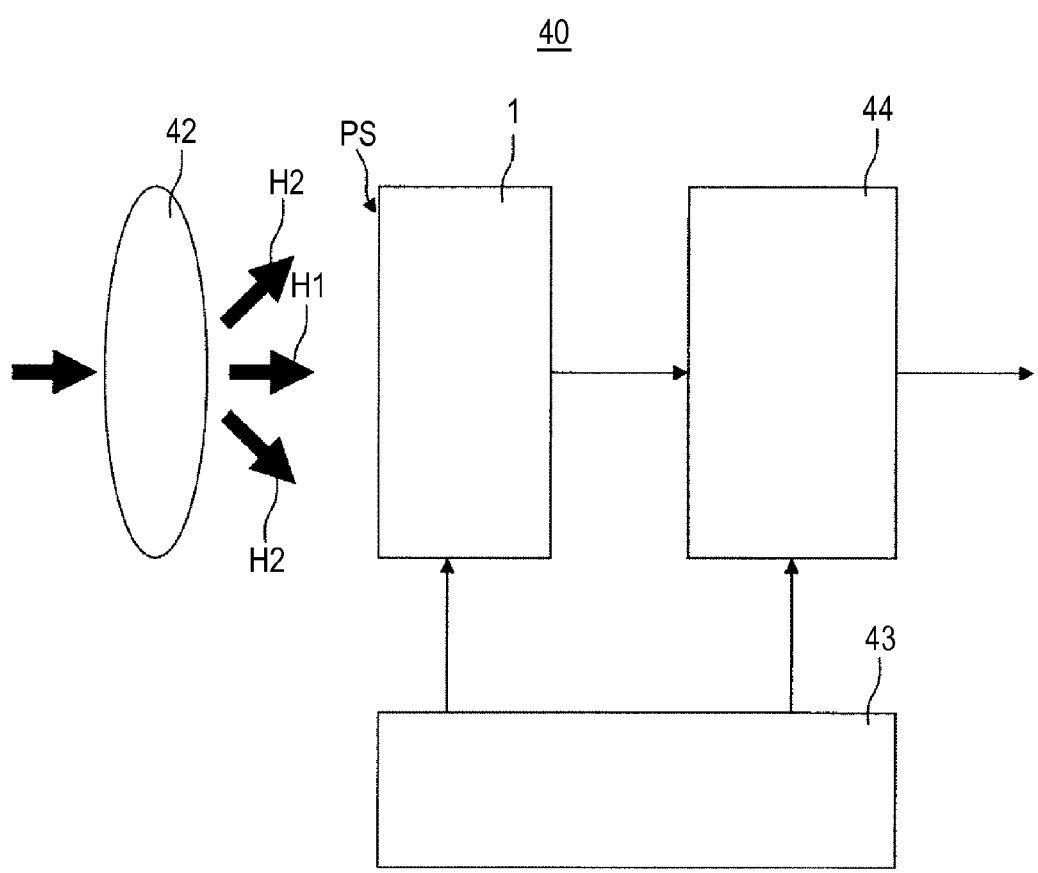
FIG. 1 is a configuration diagram showing the configuration of a camera 40 according to Embodiment 1 of the present invention.

FIG. 1 is a configuration diagram showing the configuration of a camera 40 according to Embodiment 1 of the present invention.

As shown in FIG. 1, the camera 40 includes a solid-state imaging device 1, a curved lens 42, a driving circuit 43, and a signal processing circuit 44. Each component will be sequentially described.

The solid-state imaging device 1 generates signal electric charges by receiving light (subject image) incident to an imaging surface PS through the curved lens 42 and performs photoelectric conversion for the received light. Here, the solid-state imaging device 1 is driven in accordance with a driving signal that is output from the driving circuit 43. In particular, the solid-state imaging device 1 reads out the signal electric charges and outputs raw data.

In this embodiment, as shown in FIG. 1, a main light beam H1 that is output from the curved lens 42 is incident to the center portion of the imaging surface PS at an angle to be perpendicular to the imaging surface PS of the solid-state imaging device 1. On the other hand, a main light beam H2 is incident to the peripheral portion of the imaging surface PS at an angle to be tilted with respect to the direction perpendicular to the imaging surface PS of the solid-state imaging device 1.

The curved lens 42 is arranged so as to collect incident light H corresponding to a subject image on the imaging surface PS of the solid-state imaging device 1.

In this embodiment, the curved lens 42 is disposed such that the optical axis thereof is in correspondence with the center of the imaging surface PS of the solid-state imaging device 1. Accordingly, the curved lens 42, as represented in FIG. 1, emits the main light beam H1 to the center portion of the imaging surface PS of the solid-state imaging device 1 at an angle to be perpendicular to the imaging surface PS. On the other hand, in the peripheral portion of the imaging surface PS, the curved lens 42 emits the main light beam H2 at an angle to be tilted with respect to the direction perpendicular to the imaging surface PS.

The driving circuit 43 outputs various driving signals to the solid-state imaging device 1 and the signal processing circuit 44 so as to drive the solid-state imaging device 1 and the signal processing circuit 44.

The signal processing circuit 44 is configured so as to generate a digital image for a subject image by performing a signal process for the raw data that is output from the solid-state imaging device 1.

(2) Configuration of Major Portion of Solid-State Imaging Device

The entire configuration of the solid-state imaging device 1 will be described.

Figure 2:
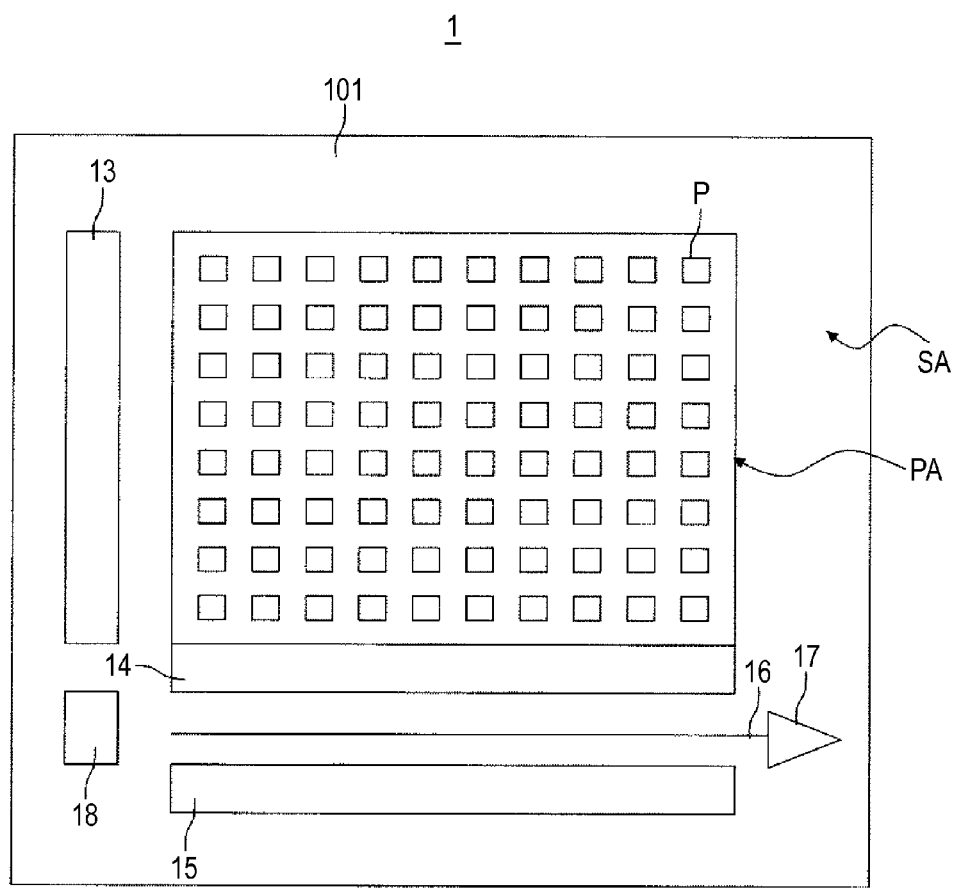
FIG. 2 is a schematic plan view showing the entire configuration of a solid-state imaging device according to Embodiment 1 of the present invention.

FIG. 2 is a schematic plan view showing the entire configuration of the solid-state imaging device 1 according to Embodiment 1 of the present invention.

The solid-state imaging device 1 according to this embodiment is a CMOS-type image sensor and includes a substrate 101 as shown in FIG. 2. This substrate 101, for example, is a semiconductor substrate that is formed from silicon. As shown in FIG. 2, an image forming area PA and a peripheral area SA are disposed on the surface of the substrate 101.

The image forming area PA, as represented in FIG. 2, has a rectangular shape, and a plurality of pixels P are disposed therein in the directions of x and y. In other words, pixels P are aligned in a matrix shape. In addition, the image forming area PA is disposed such that the center thereof is in correspondence with the optical axis of the curved lens 42 shown in FIG. 1.

This image forming area PA corresponds to the imaging surface shown in FIG. 1. Accordingly, as described above, the main light beam (H1 represented in FIG. 1) is incident to pixels P that are disposed in the center portion of the image forming area PA at an angle to be perpendicular to the surface of the image forming area PA. On the other hand, the main light beam (H2 represented in FIG. 1) is incident to pixels P that are disposed in the peripheral portion of the image forming area PA at an angle to be tilted with respect to the direction perpendicular to the surface of the image forming area PA.

The peripheral area SA, as shown in FIG. 2, is disposed on the periphery of the image forming area PA. In the peripheral area SA, peripheral circuits that process the signal electric charges generated for the pixels P are disposed.

In particular, as shown in FIG. 2, as the peripheral circuits, a vertical selection circuit 13, a column circuit 14, a horizontal selection circuit 15, a horizontal signal line 16, an output circuit 17, and a timing generator (TG) 18 are disposed.

The vertical selection circuit 13, for example, includes a shift register and selects the pixels P so as to be driven in units of a row.

The column circuit 14, for example, includes an S/H (sample and hold) circuit and a CDS (Correlated Double Sampling) circuit. The column circuit 14 performs signal processing for signals read out from the pixels P in units of a column.

The horizontal selection circuit 15, for example, includes a shift register and sequentially selects the signals read out from the pixels P by the column circuit 14 so as to be output. Then, in accordance with the selective driving performed by the horizontal selection circuit 15, the signals read out from the pixels P are sequentially output to the output circuit 17 through the horizontal signal line 16.

The output circuit 17, for example, includes a digital amplifier, performs signal processing such as an amplification process for the signals output from the horizontal selection circuit 15, and then outputs the signals externally.

The timing generator 18 generates various timing signals and outputs the timing signals to the vertical selection circuit 13, the column circuit 14, and the horizontal selection circuit 15, thereby performing driving control for each unit.

(3) Configuration of Major Portion of Pixel

Figure 3:
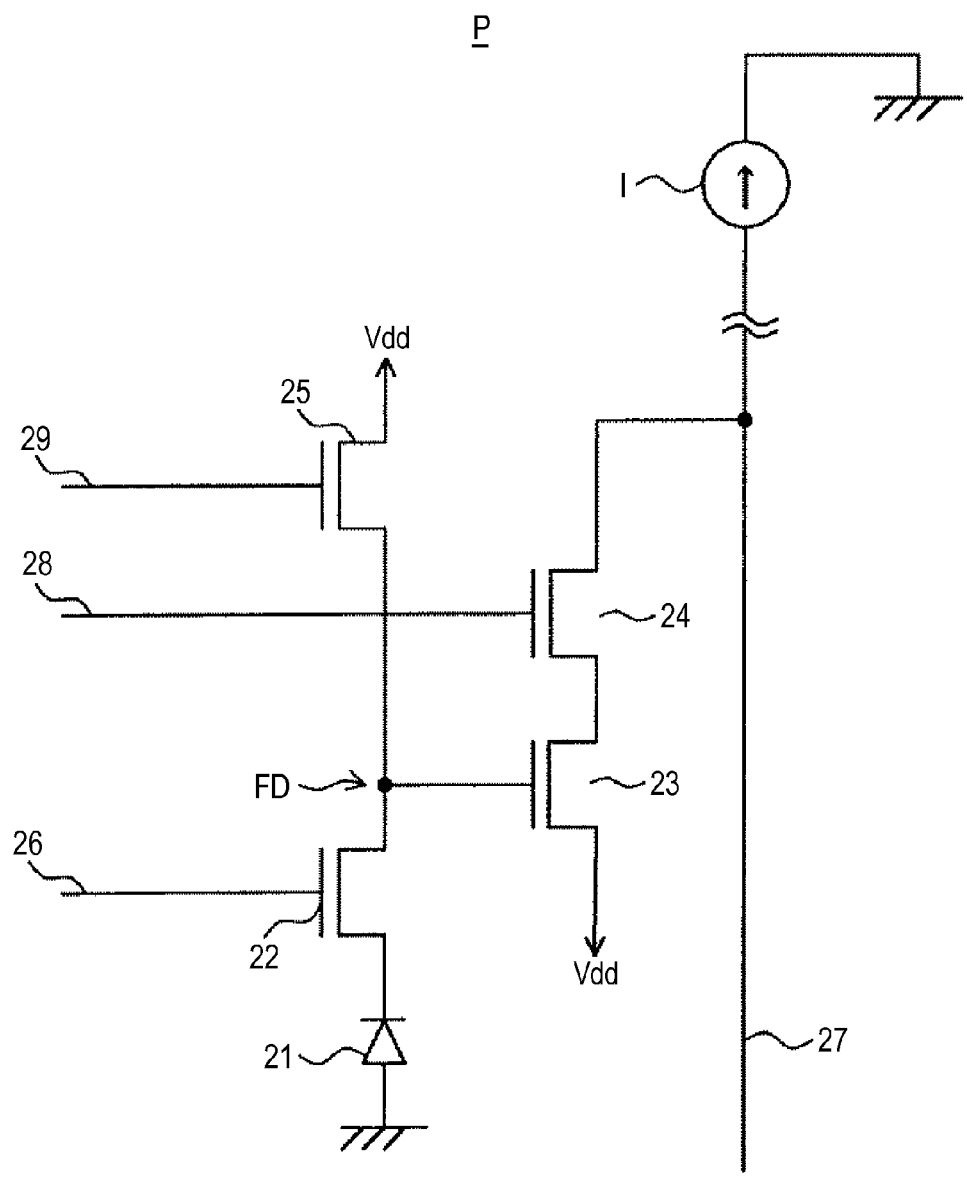
FIG. 3 is a circuit diagram showing a major portion of a pixel P, which is disposed in an image forming area PA, according to Embodiment 1 of the present invention.

FIG. 3 is a circuit diagram showing a major portion of the pixel P, which is disposed in the image forming area PA, according to Embodiment 1 of the present invention.

The pixel P disposed in the image forming area PA, as shown in FIG. 3, includes a photo diode 21, a transmission transistor 22, an amplifier transistor 23, an address transistor 24, and a reset transistor 25. In other words, a photo diode 21 and a pixel transistor that reads signal electric charges from the photo diode 21 are disposed.

In the pixel P, the photo diode 21 receives light corresponding to a subject image and performs photoelectric conversion for the received light, thereby generating and accumulating signal electric charges. The photo diode 21, as shown in FIG. 3, is connected to the gate of the amplifier transistor 23 through the transmission transistor 22. In addition, the signal electric charges accumulated in the photo diode 21 are transmitted to a floating diffusion FD, which is connected to the gate of the amplifier transistor 23, by the transmission transistor 22 as an output signal.

In the pixel P, the transmission transistor 22, as shown in FIG. 3, is disposed so as to be interposed between the photo diode 21 and the floating diffusion FD. The transmission transistor 22 transmits the signal electric charges accumulated in the photo diode 21 to the floating diffusion FD as an output signal in accordance with application of a transmission pulse from the transmission line 26 to the gate of the transmission transistor 22.

In the pixel P, the amplifier transistor 23, as shown in FIG. 3, has the gate connected to the floating diffusion FD and amplifies an output signal that is output through the floating diffusion FD. Here, the amplifier transistor 23 is connected to the vertical signal line 27 through the address transistor 24 and configures a source follower together with a static current source I that is disposed in an area other than the image forming area PA. The amplifier transistor 23 amplifies an output signal output from the floating diffusion FD in accordance with supply of an address signal to the address transistor 24.

In the pixel P, the address transistor 24, as shown in FIG. 3, has the gate connected to the address line 28 to which the address signal is supplied. When being supplied with the address signal, the address transistor 24 is in the ON state and outputs the output signal amplified by the amplifier transistor 23 as described above to the vertical signal line 27. Then, the output signal is output to the S/H circuit and the CDS circuit of the above-described column circuit 14 through the vertical signal line 27.

In the pixel P, the reset transistor 25, as shown in FIG. 3, has the gate connected to the reset line 29 to which a reset signal is supplied and is connected so as to be interposed between the power source Vdd and the floating diffusion FD. When a reset signal is supplied to the gate of the reset transistor 25 from the reset line 29, the reset transistor 25 resets the electric potential of the floating diffusion FD to the electric potential of the power source Vdd.

The gates of the transistors 22, 24, and 25 are connected in units of a row that is configured by a plurality of pixels aligned in the horizontal direction x. Thus, the above-described operation for driving the pixel is simultaneously performed for a plurality of pixels aligned in the unit of a row. In particular, the pixels are sequentially selected in the vertical direction in units of a horizontal line (pixel row) in accordance with the address signal that is supplied by the above-described vertical selection circuit 13. Then, the transistor of each pixel is controlled in accordance with various timing signals output from the timing generator 18. Accordingly, the output signals of each pixel are read out by the S/H circuits and the CDS circuits of the column circuits 14 of each pixel column through the vertical signal line 27.

(4) Detailed Configuration of Solid-State Imaging Device

The solid-state imaging device 1 according to this embodiment will be described in detail.

Figure 4:
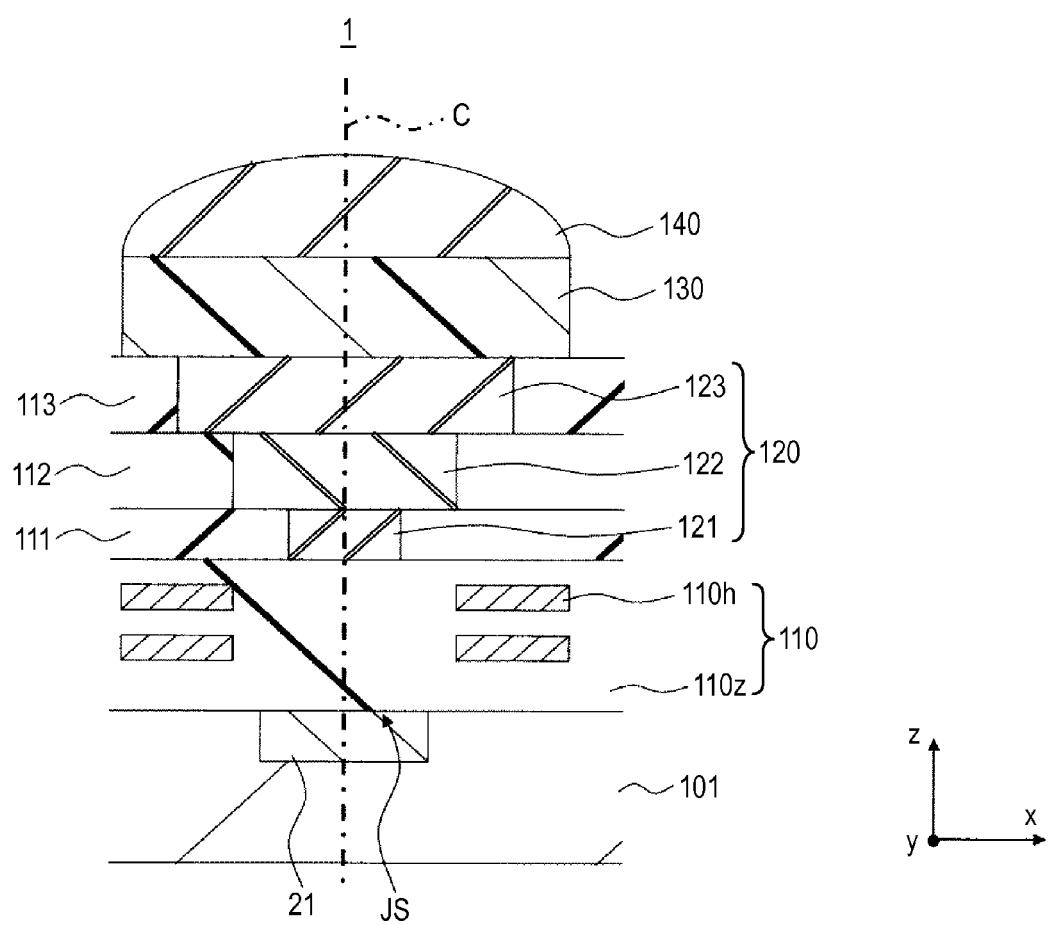
FIG. 4 is a cross-sectional view representing a major portion of a solid-state imaging device 1 according to Embodiment 1 of the present invention.
Figure 5:
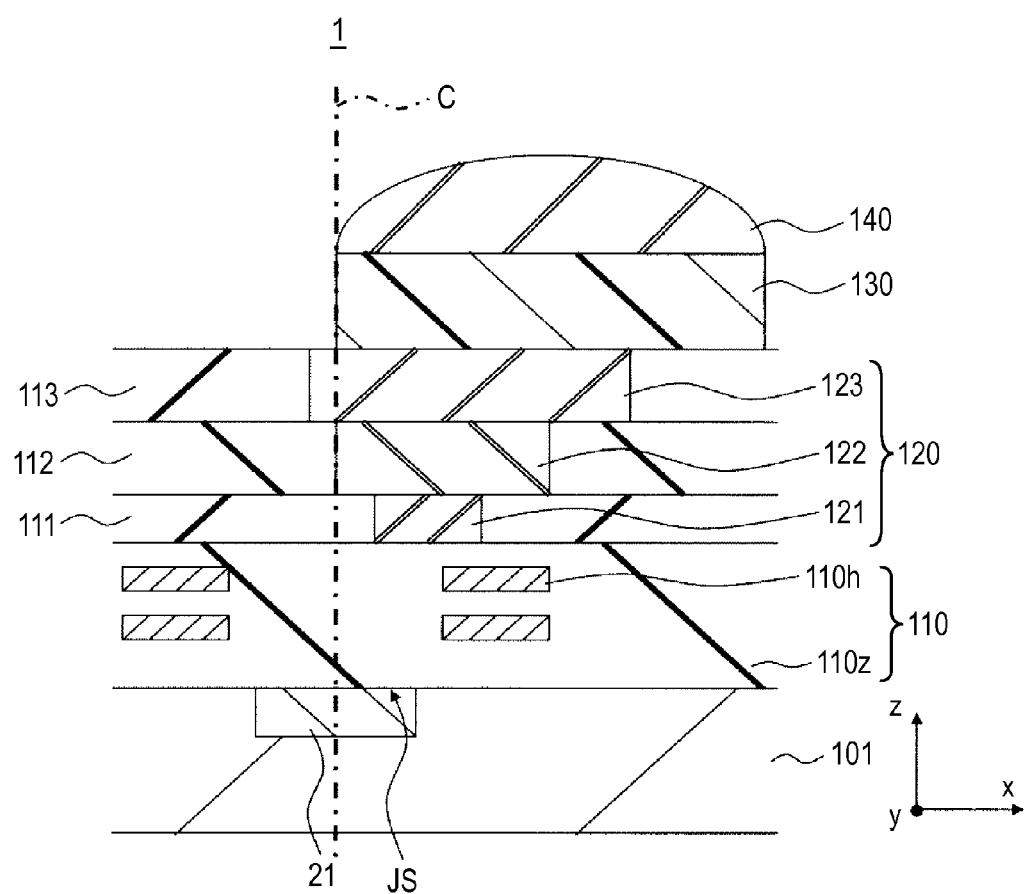
FIG. 5 is a cross-sectional view representing a major portion of a solid-state imaging device 1 according to Embodiment 1 of the present invention.

FIG. 4 and FIG. 5 are cross-sectional views representing major portions of the solid-state imaging device 1 according to Embodiment 1 of the present invention. Here, FIG. 4 shows a cross-section of the pixel P disposed in the center portion of the image forming area PA represented in FIG. 2. On the other hand, FIG. 5 shows a cross-section of the pixel P disposed in the peripheral portion of the image forming area PA represented in FIG. 2. FIG. 5 shows a case where the right side is the center side of the image forming area PA, and the left side is the peripheral side of the image forming area PA.

In the image forming area PA, the pixel P is configured as represented in FIG. 3. However, members other than the photo diode 21, which configure the pixel P, are not shown in the figures.

As shown in FIGS. 4 and 5, in the solid-state imaging device 1, a photo diode 21, an inner-layer lens 120, a color filter 130, and an on-chip lens 140 are formed in correspondence with a pixel P. In addition, here, as shown in FIGS. 4 and 5, the inner-layer lens 120 is configured by a first inner-layer lens material layer 121, a second inner-layer lens material layer 122, and a third inner-layer lens material layer 123.

Each portion will be sequentially described.

The photo diode 21, as shown in FIGS. 4 and 5, is disposed on the surface of the substrate 101. The photo diode 21 generates signal electric charges by receiving light on a light reception surface JS and performing photoelectric conversion for the received light. A plurality of the photo diodes 21 are disposed on the surface of the substrate 101 in correspondence with a plurality of the pixels P shown in FIG. 2.

In addition, on the upper side of the photo diode 21, a wiring layer 110 is disposed. In the wiring layer 110, wirings 110h electrically connected to each element are formed inside an insulating layer 110z. The insulating layer 110z is formed from a light-transmissive material through which light can be transmitted. For example, the insulating layer 110z is formed from a silicon oxide film (refractive index n=1.43). In addition, the wiring 110h is formed from a conductive material such as a metal.

Additionally, on the upper side of the photo diode 21, as shown in FIGS. 4 and 5, the inner-layer lens 120, the color filter 130, and the on-chip lens 140 are disposed. Here, from the side of the light reception surface JS, the inner-layer lens 120, the color filter 130, and the on-chip lens 140 are sequentially disposed.

In this embodiment, as can be noticed by comparing FIGS. 4 and 5 with each other, the positions of the portions 120, 130, and 140 with respect to the photo diode 21 differ in correspondence with the position of the pixel P. Here, the center positions of the portions 120, 130, and 140 are disposed so as to be shifted further to the center side of the image forming area PA with respect to the center of the light reception surface JS of the photo diode 21 as the position of the pixel P disposed on the image forming area PA is more distant from the center side of the image forming area PA.

In particular, as shown in FIG. 4, in the pixel P disposed in the center portion of the image forming area PA, the center positions of the portions 120, 130, and 140 coincide with the center axis C of the light reception surface JS on the upper side of the light reception surface JS.

On the other hand, as shown in FIG. 5, in the pixel P disposed in the peripheral portion of the image forming area PA, the center positions of the portions 120, 130, and 140 do not coincide with the center axis C of the light reception surface JS but are shifted to one side along the xy plane, on the upper side of the light reception surface JS. FIG. 5, as described above, shows a case where the right side is the center side of the image forming area PA, and the left side is the peripheral side of the image forming area PA. Accordingly, the center positions of the portions 120, 130, and 140 are disposed so as to be shifted to the right side with respect to the center of the light reception surface JS.

Although not shown in the figure, in contrast to FIG. 5, in a case where the left side is the center side of the image forming area PA, and the right side is the peripheral side of the image forming area PA, the center positions of the portions 120, 130, and 140 are disposed so as to be shifted to the left side with respect to the center of the light reception surface JS. In other words, the portions 120, 130, and 140 are disposed such that the pitches of the portions 120, 130, and 140 are less than the pitch of the photo diodes 21 disposed in the pixels P.

The inner-layer lens 120, as shown in FIGS. 4 and 5, are formed so as to be positioned on the wiring layer 110 to the upper side of the surface of the substrate 101.

In this embodiment, as can be noticed by comparing FIGS. 4 and 5 with each other, the position of the inner-layer lens 120 with respect to the photo diode 21 differs in correspondence with the position of the pixel P. Here, the center position of the inner-layer lens 120 is disposed so as to be shifted further to the center side of the image forming area PA with respect to the center of the light reception surface JS of the photo diode 21 as the position of the pixel P disposed in the image forming area PA is more distant from the center of the image forming area PA. In other words, the inner-layer lenses 120 are disposed such that the pitch of the inner-layer lenses 120 is less than the pitch of the photo diodes 21 disposed in the pixels P.

In addition, the inner-layer lens 120 is configured to collect light output from the color filter 130 on the surface of the substrate 101. In particular, the inner-layer lens 120 is formed such that the center portion is thicker than the edge portion in the direction toward the light reception surface JS of the photo diode 21.

In this embodiment, the inner-layer lens 120, as shown in FIGS. 4 and 5, is formed such that the area of the face along the light reception surface JS of the photo diode 21 sequentially decreases in a stepped manner in a direction from the on-chip lens 140 side toward the photo diode 21 side.

In particular, the inner-layer lens 120 includes a first lens material layer 121, a second lens material layer 122, and a third lens material layer 123. The first to third lens material layers 121, 122, and 123 are sequentially stacked on the upper side of the light reception surface JS of the photo diode 21. In the inner-layer lens 120, side faces of the lens material layers 121, 122, and 123 are disposed in different positions in the direction of the xy plane such that different levels are formed on the side face along the z direction that is perpendicular to the light reception surface JS.

The lens material layers 121, 122, and 123 are respectively formed by using optical materials that have refractive indices higher than those of the interlayer insulating films 111, 112, and 113 disposed on the periphery thereof. For example, the lens material layers 121, 122, and 123 are formed by using silicon nitride (refractive index: 2.0) that is deposited by using a plasma CVD method.

In the inner-layer lens 120, the first lens material layer 121, as shown in FIGS. 4 and 5, is disposed in a position closest to the light reception surface JS among the plurality of the lens material layers 121, 122, and 123.

In addition, in the inner-layer lens 120, the second lens material layer 122, as shown in FIGS. 4 and 5, is disposed between the first lens material layer 121 and the third lens material layer 123.

In addition, in the inner-layer lens 120, the third lens material layer 123, as shown in FIGS. 4 and 5, is disposed in a position that is the most distant from the light reception surface JS among the plurality of the lens material layers 121, 122, and 123.

Figure 6:
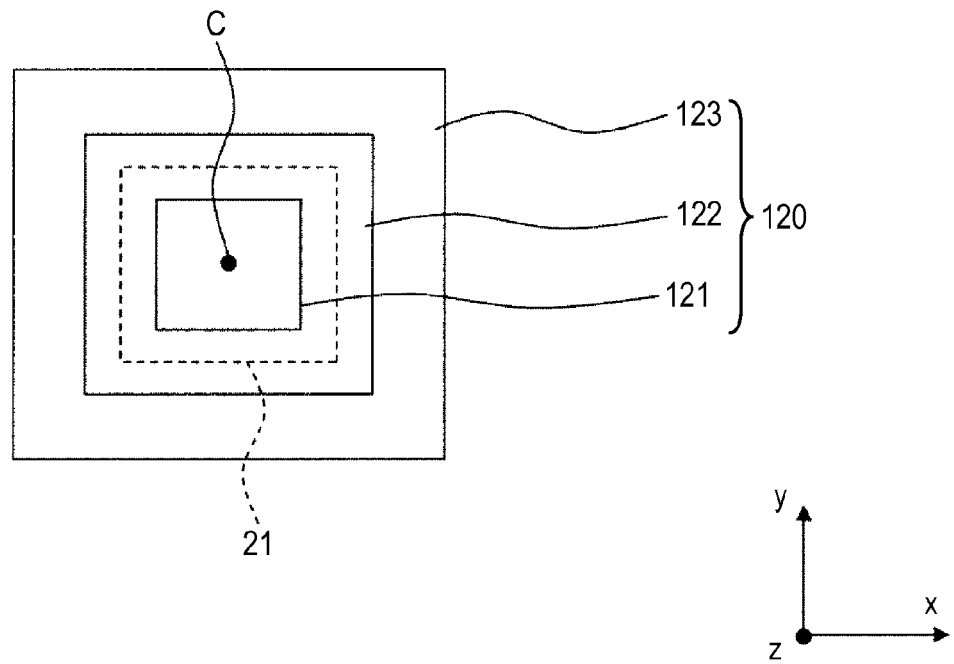
FIG. 6 is a plan view showing the relationship between lens material layers configuring an inner-layer lens 120 and a photo diode 21, according to Embodiment 1 of the present invention.
Figure 7:
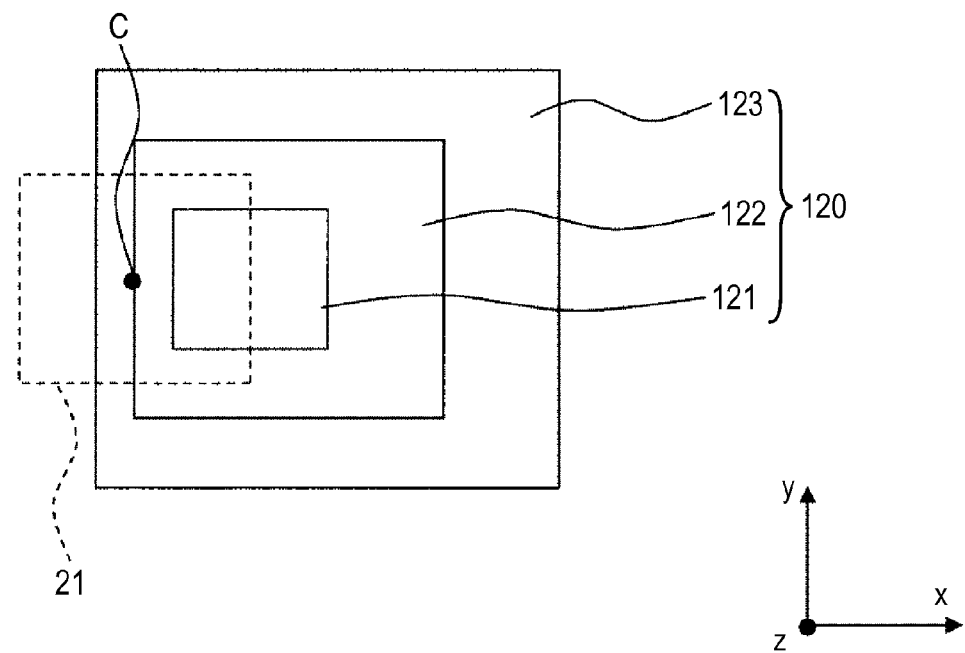
FIG. 7 is a plan view showing the relationship between lens material layers configuring an inner-layer lens 120 and a photo diode 21, according to Embodiment 1 of the present invention.

FIG. 6 and FIG. 7 are plan views showing the relationship between the lens material layers 121, 122, and 123 configuring the inner-layer lens 120 and the photo diode 21, according to Embodiment 1 of the present invention. Here, FIG. 6, similarly to FIG. 4, represents a portion of the pixel P disposed in the center portion of the image forming area PA represented in FIG. 2. On the other hand, FIG. 7, similarly to FIG. 5, represents a portion of the pixel P disposed in the peripheral portion of the image forming area PA represented in FIG. 2. In FIGS. 6 and 7, for convenience of illustration, the lens material layers 121, 122, and 123 configuring the inner-layer lens 120 are represented, and the photo diode 21 is denoted by a dotted line.

As shown in FIGS. 6 and 7, the planar shapes of the first to third lens material layers 121, 122, and 123 are rectangles and are formed to be similar to one another. In other words, the lens material layers 121, 122, and 123 are formed to have the same pattern but to have different areas. Here, the first lens material 121 is formed to have an area larger than that of the second lens material 122. In addition, the second lens material layer 122 is formed to have an area larger than that of the third lens material layer 123.

In other words, the plurality of the lens material layers 121, 122, and 123 are formed such that the lower face of the first lens material layer 121, which is the closest to the photo diode 21, has an area smaller than that of the upper face of the third lens material layer 123, which is the most distant from the photo diode 21.

In particular, as shown in FIG. 6, in the pixel P disposed in the center portion of the image forming area PA, the center position of each of the lens material layers 121, 122, and 123 is disposed so as to coincide with the center C of the light reception surface JS of the photo diode 21.

On the other hand, as shown in FIG. 7, in the pixel P disposed in the peripheral portion of the image forming area PA, the center positions of the lens material layers 121, 122, and 123 do not coincide with the center C of the light reception surface JS of the photo diode 21 and are shifted to one side along the xy plane. FIG. 7, similarly to FIG. 5, shows a case where the right side is the center side of the image forming area PA, and the left side is the peripheral side of the image forming area PA. Accordingly, in this portion, the center positions of the first to third lens material layers 121, 122, and 123 are disposed so as to be sequentially shifted to the right side with respect to the center C of the light reception surface JS of the photo diode 21.

The color filter 130, as shown in FIG. 4 and FIG. 5, is formed so as to be positioned on the inner-layer lens 120 on the upper side of the surface of the substrate 101. The color filter 130 is configured to allow the light corresponding to the subject image to be colored and outputs the colored light to the surface of the substrate 101. For example, the color filter 130 is formed by coating with a coating solution containing a coloring pigment and photoresist resin by using a coating method such as a spin coating method so as to form a coating film and then by patterning and processing the coating film by using lithographic technology. Although not shown in the figure, the color filter 130 is disposed in each pixel P as one of a green filter layer, a red filter layer, and a blue filter layer. For example, each of the green filter layer, the red filter layer, and the blue filter layer is disposed in a Bayer arrangement so as to be parallel to one another.

In this embodiment, as can be noticed by comparing FIGS. 4 and 5 with each other, the position of the color filter 130 with respect to the photo diode 21 differs in correspondence with the position of the pixel P. Here, the center position of the color filter 130 is disposed so as to be shifted further to the center side of the image forming area PA with respect to the center of the light reception surface JS of the photo diode 21 as the position of the pixel P disposed in the image forming area PA is more distant from the center of the image forming area PA. In other words, the color filters 130 are disposed such that the pitch of the color filters 130 is less than the pitch of the photo diodes 21 disposed in the pixels P. In addition, the color filters 130 are disposed such that the pitch of the color filters 130 is less than that of the inner-layer lenses 120 disposed in the pixels P.

The on-chip lens 140, as shown in FIG. 4 and FIG. 5, is formed so as to be positioned on the color filter 130 on the upper side of the surface of the substrate 101. This on-chip lens 140 is configured so as to collect incident light onto the light reception surface JS of the photo diode 21. In particular, the on-chip lens 140 is formed such that the center portion is thicker than the edge portion in a direction toward the light reception surface JS of the photo diode 21.

In this embodiment, as can be noticed by comparing FIGS. 4 and 5 with each other, the position of the on-chip lens 140 with respect to the photo diode 21 differs in correspondence with the position of the pixel P. Here, the center position of the on-chip lens 140 is disposed so as to be shifted further to the center side of the image forming area PA with respect to the center of the light reception surface JS of the photo diode 21 as the position of the pixel P disposed in the image forming area PA is more distant from the center of the image forming area PA. In other words, the on-chip lenses 140 are disposed such that the pitch of the on-chip lenses 140 is less than the pitch of the photo diodes 21 disposed in the pixels P. In addition, the on-chip lenses 140 are disposed such that the pitch of the on-chip lenses 140 is less than that of the inner-layer lenses 120 disposed in the pixels P.

[Manufacturing Method]

Hereinafter, a major portion of a manufacturing method for manufacturing the above-described solid-state imaging device 1 will be described. In particular, a process for forming the inner-layer lens 120 in the solid-state imaging device 1 will be described in detail.

FIGS. 8A, 8B, 9A, 9B, 10A, and 10B are cross-sectional views representing major portions disposed in each process of the method of manufacturing the solid-state imaging device 1 according to Embodiment 1 of the present invention. FIGS. 8A, 9A, and 10A, similarly to FIG. 4, show the portion of the pixel P disposed in the center portion of the image forming area PA represented in FIG. 2. On the other hand, FIGS. 8B, 9B, and 10B, similarly to FIG. 5, show the portion of the pixel P disposed in the peripheral portion of the image forming area PA represented in FIG. 2.

(1) Formation of First Lens Material Layer 121

First, as represented in FIGS. 8A and 8B, the first lens material layer 121 that configures the inner-layer lens 120 is formed.

Here, as shown in FIGS. 8A and 8B, the first lens material layer 121 is formed on the wiring layer 110.

For example, the interlayer insulating film 111 is formed on the wiring layer 110. Then, an opening is formed in an area, which forms the first lens material layer 121, of the interlayer insulating film 111. For example, the interlayer insulating film 111 is formed by forming a silicon oxide film by using a CVD method. Then, for example, the opening is formed in the interlayer insulating film 111, for example, by using photolithographic technology.

In this embodiment, for example, by performing an anisotropic etching process, this formation process is performed such that the side face of the opening is formed in a direction perpendicular to the surface of the substrate 101.

Thereafter, by forming an optical material as a film so as to bury the opening formed in the interlayer insulating film 111, the first lens material layer 121 is formed. For example, after silicon nitride is deposited by using the plasma CVD method, the surface is flattened by performing a CMP (Chemical Mechanical Polishing) process. Accordingly, the first lens material layer 121 is formed inside the opening.

In this embodiment, as represented in FIGS. 8A and 8B, the first lens material layer 121 is formed such that the position of the first lens material layer 121 with respect to the photo diode 21 differs in correspondence with the position of the pixel P in the image forming area PA.

In particular, this formation process is performed such that the center position of the first lens material layer 121 is shifted further to the center side of the image forming area PA with respect to the center of the light reception surface JS of the photo diode 21 as the position of the pixel P disposed in the image forming area PA is more distant from the center of the image forming area PA. In other words, the first lens material layer 121 is formed such that the pitch of the first lens material layer 121 is less than the pitch of the photo diodes 21 disposed in the pixels P.

(2) Formation of Second Lens Material Layer 122

Next, as represented in FIGS. 9A and 9B, the second lens material layer 122 that configures the inner-layer lens 120 is formed.

Here, as represented in FIGS. 9A and 9B, the second lens material layer 122 is formed on the first lens material layer 121.

For example, after the interlayer insulating film 112 is formed on the first lens material layer 121, an opening is formed in an area, which forms the second lens material layer 122, of the interlayer insulating film 112. Similarly to the case of the first lens material layer 121, the opening is formed in the interlayer insulating film 112.

Thereafter, similarly to the case of the first lens material layer 121, the second lens material layer 122 is formed by burying an optical material in the opening that is formed in the interlayer insulating film 112.

In this embodiment, as represented in FIGS. 9A and 9B, similarly to the first lens material layer 121, the second lens material layer 122 is formed such that the position of the second lens material layer 122 with respect to the photo diode 21 differs in correspondence with the position of the pixel P in the image forming area PA.

In particular, this formation process is performed such that the center position of the second lens material layer 122 is shifted further to the center side of the image forming area PA with respect to the center of the light reception surface JS of the photo diode 21 as the position of the pixel P disposed in the image forming area PA is more distant from the center of the image forming area PA. Here, the second lens material layers 122 are formed such that the pitch of the second lens material layers 122 is less than the pitch of the first lens material layers 121 of the pixels P.

(3) Formation of Third Lens Material Layer 123

Next, as represented in FIGS. 10A and 10B, the first lens material layer 121 that configures the inner-layer lens 120 is formed.

Here, as represented in FIGS. 10A and 10B, the third lens material 123 is formed on the second lens material layer 122.

For example, after the interlayer insulating film 113 is formed on the second lens material layer 122, an opening is formed in an area, which forms the third lens material layer 123, of the interlayer insulating film 113. Similarly to the cases of the first and second lens material layers 121 and 122, the opening is formed in the interlayer insulating film 113.

Thereafter, similarly to the cases of the first and second lens material layers 121 and 122, the third lens material layer 123 is formed by burying an optical material in the opening that is formed in the interlayer insulating film 113.

In this embodiment, as represented in FIGS. 10A and 10B, the third lens material layer 123 is formed such that the position of the third lens material layer 123 with respect to the photo diode 21 differs in correspondence with the position of the pixel P in the image forming area PA.

In particular, this formation process is performed such that the center positions of the second lens material layer 122 and the third lens material layer 123 are shifted further to the center side of the image forming area PA with respect to the center of the light reception surface JS of the photo diode 21 as the position of the pixel P disposed in the image forming area PA is more distant from the center of the image forming area PA. Here, the third lens material layers 123 are formed such that the pitch of the third lens material layers 123 is less than the pitch of the second lens material layers 122 of the pixels P.

Thereafter, as shown in FIGS. 4 and 5, the color filter 130 and the on-chip lens 140 are formed, and thereby the solid-state imaging device 1 is completed.

[Operation]

Figure 11:
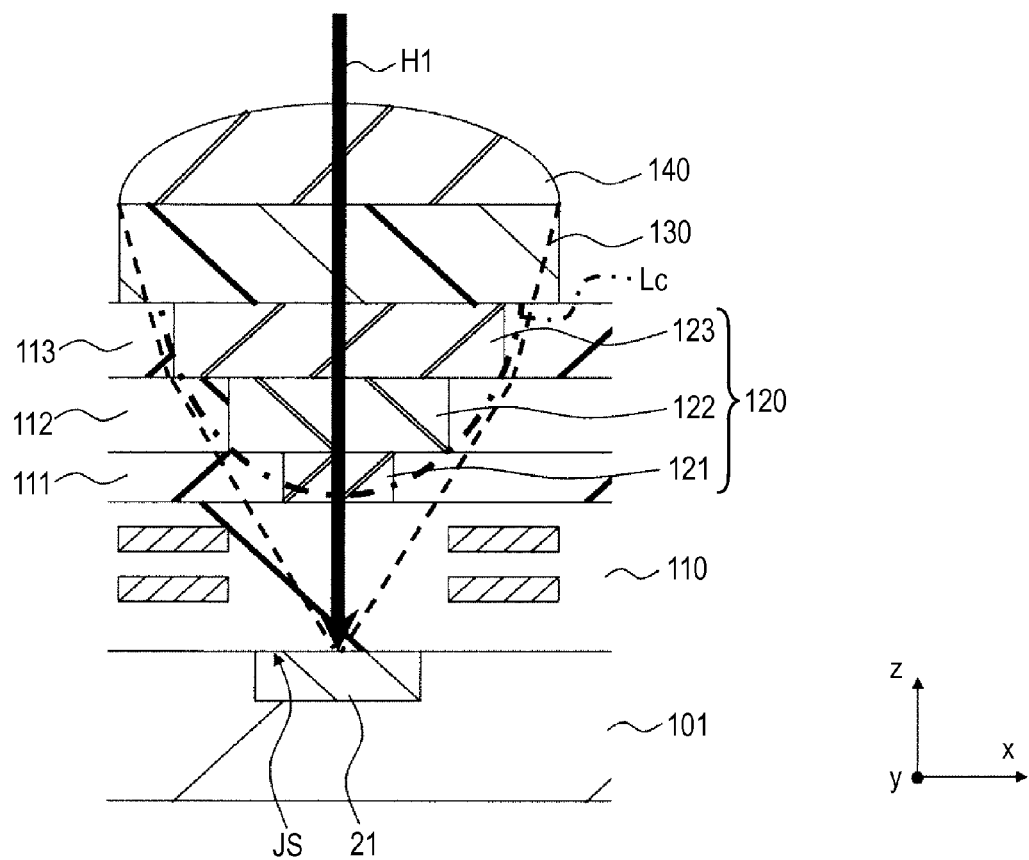
FIG. 11 is a diagram showing the appearance of a main light beam incident to a solid-state imaging device 1 according to Embodiment 1 of the present invention.
Figure 12:
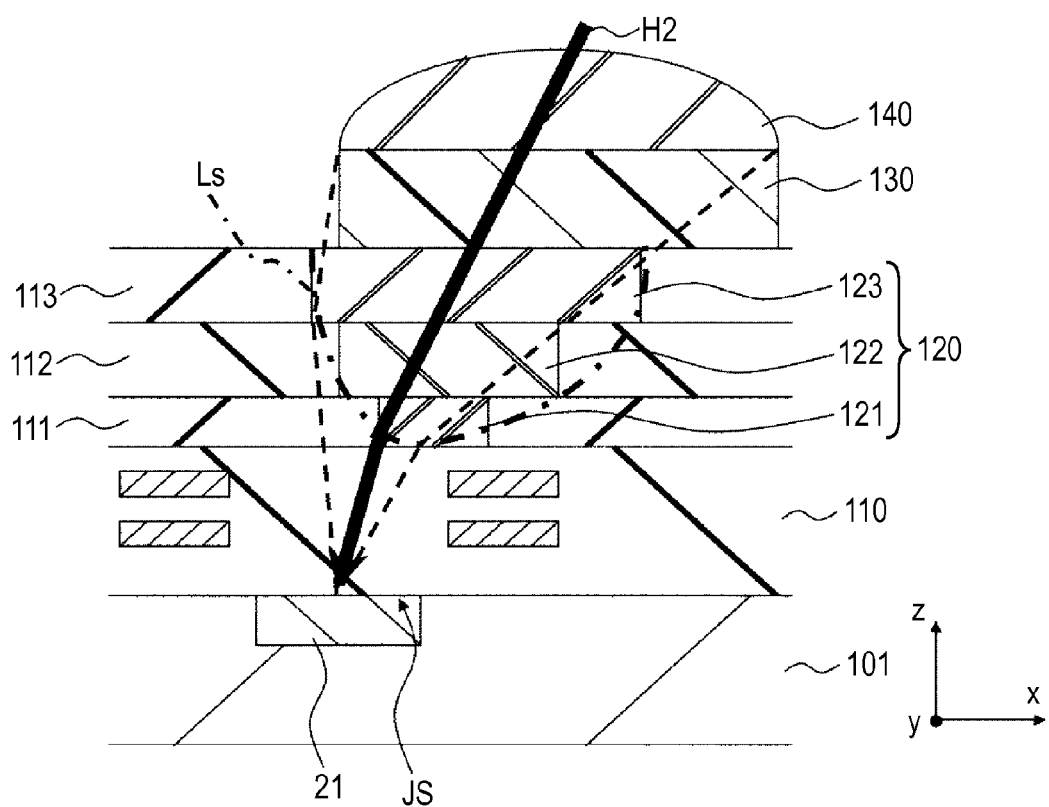
FIG. 12 is a diagram showing the appearance of a main light beam incident to a solid-state imaging device 1 according to Embodiment 1 of the present invention.

FIGS. 11 and 12 are diagrams showing the appearance of a main light beam incident to the solid-state imaging device 1 according to Embodiment 1 of the present invention. Here, FIG. 11, similarly to FIG. 4, represents a portion of the pixel P that is disposed in the center portion of the image forming area PA represented in FIG. 2. On the other hand, FIG. 12, similarly to FIG. 5, represents a portion of the pixel P that is disposed in the peripheral portion of the image forming area PA represented in FIG. 2.

As illustrated in FIG. 11, in the center portion of the image forming area PA, the main light beam H1 is incident from the upper side of the photo diode 21 to the light reception surface JS at an angle to be perpendicular to the light reception surface JS. Then, the main light beam H1 is incident to the color filter 130 through the on-chip lens 140 with the angle maintained. Thereafter, as shown in FIG. 11, the main light beam H1 output from the color filter 130 is incident to the inner-layer lens 120.

Here, the inner-layer lens 120 forms a lens surface Lc as denoted by a dashed-dotted line shown in FIG. 11. In other words, the inner-layer lens 120 is formed as a downward convex lens having the lens surface Lc symmetrical to an axis perpendicular to the center of the light reception surface JS. Accordingly, from the inner-layer lens 120, similarly to the case of the on-chip lens 140, the main light beam H1 is output at an angle perpendicular to the light reception surface JS. Then, this main light beam H1 is incident to the light reception surface JS of the photo diode 21 through the wiring layer 110.

On the other hand, as illustrated in FIG. 12, in the peripheral portion of the image forming area PA, the main light beam H2 is incident from the upper side of the photo diode 21 to the light reception surface JS at an angle tilted with respect to the direction perpendicular to the light reception surface JS. Then, the main light beam H2 is incident to the color filter 130 through the on-chip lens 140 with the angle maintained. Thereafter, as illustrated in FIG. 12, the main light beam H2 output from the color filter 130 is incident to the inner-layer lens 120.

Here, the inner-layer lens 120 forms a lens surface Ls as denoted by a dashed-dotted line shown in FIG. 12. The inner-layer lens 120 is formed as a downward convex lens having the lens surface Ls asymmetrical to an axis perpendicular to the center of the light reception surface JS. In other words, a lens that is formed by shifting an upside-down bell to be tilted is formed. In particular, the inner-layer leans 120, as illustrated in FIG. 12, is formed by designing the lens surface Ls so as to refract the main light beam H2, so that the main light beam H2 is close to the center of the light reception surface JS of the photo diode 21. Accordingly, the main light beam H2 output from the inner-layer lens 120 is incident to the light reception surface JS of the photo diode 21 through the wiring layer 110.

[Sum Up]

As described above, in this embodiment, on the upper side of a plurality of the photo diodes 21, a plurality of the inner-layer lenses 120 are formed in a shape protruding in directions toward the photo diodes 21. Each of the plurality of the inner-layer lenses 120 is formed such that the shape of the lens is different in the center of the image forming area PA and the periphery thereof. Here, each inner-layer lens 120 is disposed such that the center of the inner-layer lens 120 is shifted further to the center side of the image forming area PA with respect to the center of the photo diode 21 as the position of the pixel disposed in the image forming area is more distant from the center.

Accordingly, as illustrated in FIGS. 11 and 12 described above, on both the center and the periphery of the image forming area PA, the main light beams H1 and H2 can be optimally incident to the photo diode 21. Therefore, occurrence of a difference between the sensitivities of the center and the periphery of the image forming area PA can be suppressed.

As a result, according to this embodiment, the image quality of an image that is imaged can be improved.

In addition, in this embodiment, the inner-layer lens 120 is formed by stacking a plurality of lens material layers 121, 122, and 123. Accordingly, the entire shape of the inner-layer lens 120 can be designed with a high degree of freedom, and the above-described advantages can be acquired in an easy manner.

2. Embodiment 2

Configuration of Device and Others

Figure 13:
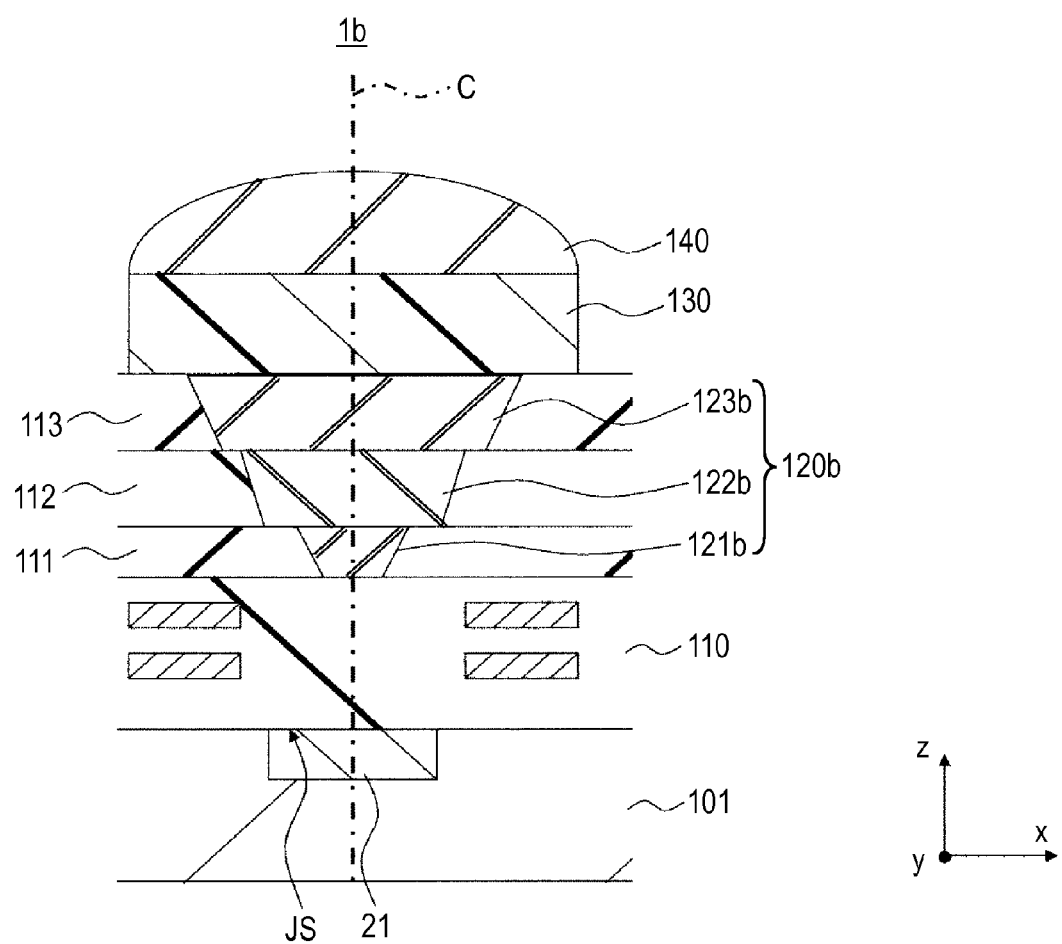
FIG. 13 is a cross-sectional view representing a major portion of a solid-state imaging device 1b according to Embodiment 2 of the present invention.
Figure 14:
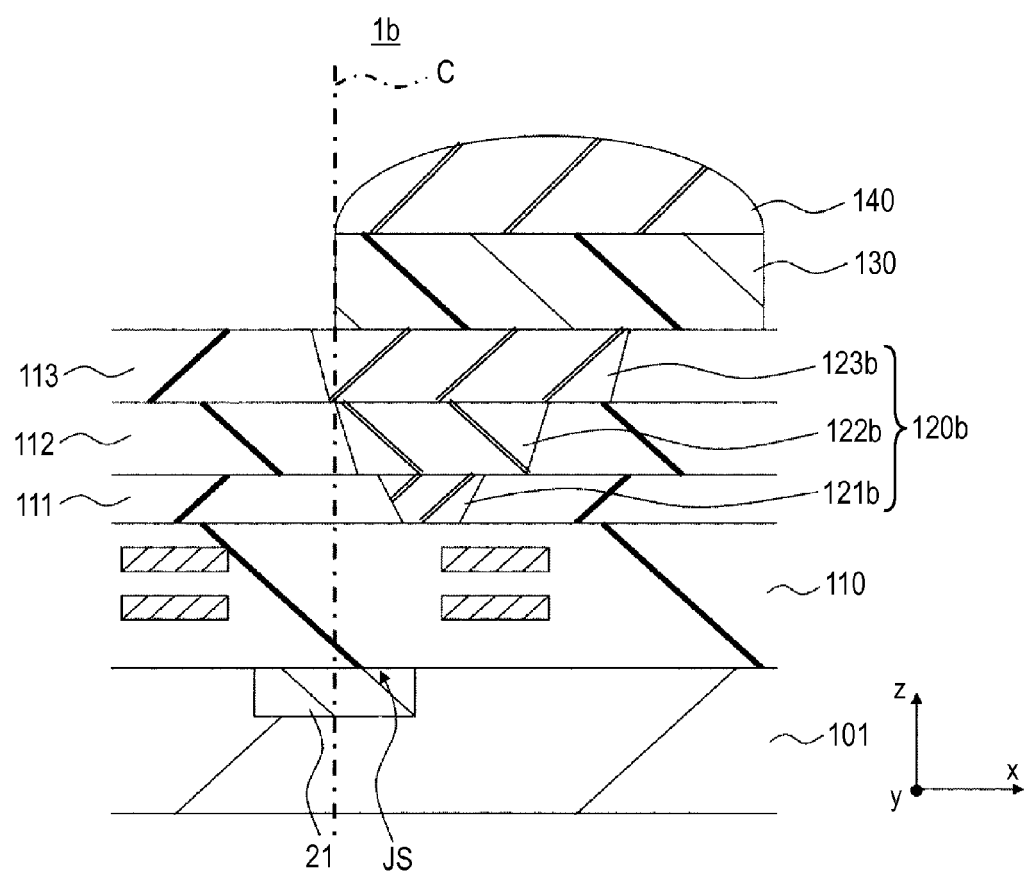
FIG. 14 is a cross-sectional view representing a major portion of a solid-state imaging device 1b according to Embodiment 2 of the present invention.

FIG. 13 and FIG. 14 are cross-sectional views representing major portions of the solid-state imaging device 1b according to Embodiment 2 of the present invention. Here, FIG. 13, similarly to FIG. 4, shows a portion of the pixel P disposed in the center portion of the image forming area PA represented in FIG. 2. On the other hand, FIG. 14, similarly to FIG. 5, shows a portion of the pixel P disposed in the peripheral portion of the image forming area PA represented in FIG. 2.

As shown in FIGS. 13 and 14, in this embodiment, an inner-layer lens 120b is different from that of Embodiment 1. Except for this point, this embodiment is the same as Embodiment 1. Thus, description of portions common to Embodiment 1 is omitted here.

The inner-layer lens 120b, as shown in FIGS. 13 and 14, similarly to that of Embodiment 1, includes first to third lens material layers 121b, 122b, and 123b.

The first to third lens material layers 121b, 122b, and 123b, differently from Embodiment 1, are formed such that the side faces thereof are tapered faces tilted with respect to the z direction that is perpendicular to the light reception surface JS.

In particular, as shown in FIGS. 13 and 14, the side face of the first lens material layer 121b is formed to be tilted such that the first lens material layer 121b is narrowed in a tapered shape from the upper side toward the lower side.

In addition, the side face of the second lens material layer 122b, similarly to that of the first lens material layer 121b, as shown in FIGS. 13 and 14, is formed to be tilted such that the second lens material layer 122b is narrowed in a tapered shape from the upper side toward the lower side. Here, the width of the lower end portion of the second lens material layer 122b is formed to be equal to or greater than that of the upper end portion of the first lens material layer 121b.

In addition, the side face of the third lens material layer 123b, similarly to those of the first and second lens material layers 121b and 122b, as shown in FIGS. 13 and 14, is formed to be tilted such that the third lens material layer 123b is narrowed in a tapered shape from the upper side toward the lower side. Here, the width of the lower end portion of the third lens material layer 123b is formed to be equal to or greater than that of the upper end portion of the second lens material layer 122b.

The lens material layers 121b, 122b, and 123b are formed by burying lens materials in openings formed in the interlayer insulating films 111, 112, and 113. In this embodiment, each opening is formed such that the side face of the opening is in a tapered shape having a wider width toward the upper side in the z direction that is perpendicular to the light reception surface JS. In particular, each opening is formed by performing an isotropic etching process.

[Sum Up]

As described above, in this embodiment, each of the first to third lens material layers 121b, 122b, and 123b configuring the inner-layer lens 120b is formed such that the side face thereof is a tapered face titled with respect to the z direction that is perpendicular to the light reception surface JS. In other words, the inner-layer lens 120b is formed such that the side faces of the lens material layers 121b, 122b, and 123b are along the lens surfaces Lc and Ls shown in FIGS. 11 and 12. Accordingly, scattering of the light incident to the inner-layer lens 120b on the lens surface can be suppressed.

As a result, according to this embodiment, occurrence of a decrease in the sensitivity due to scattering can be prevented, and thereby the image quality of an image that is imaged can be improved.

3. Embodiment 3

Configuration of Device and Others

Figure 15:
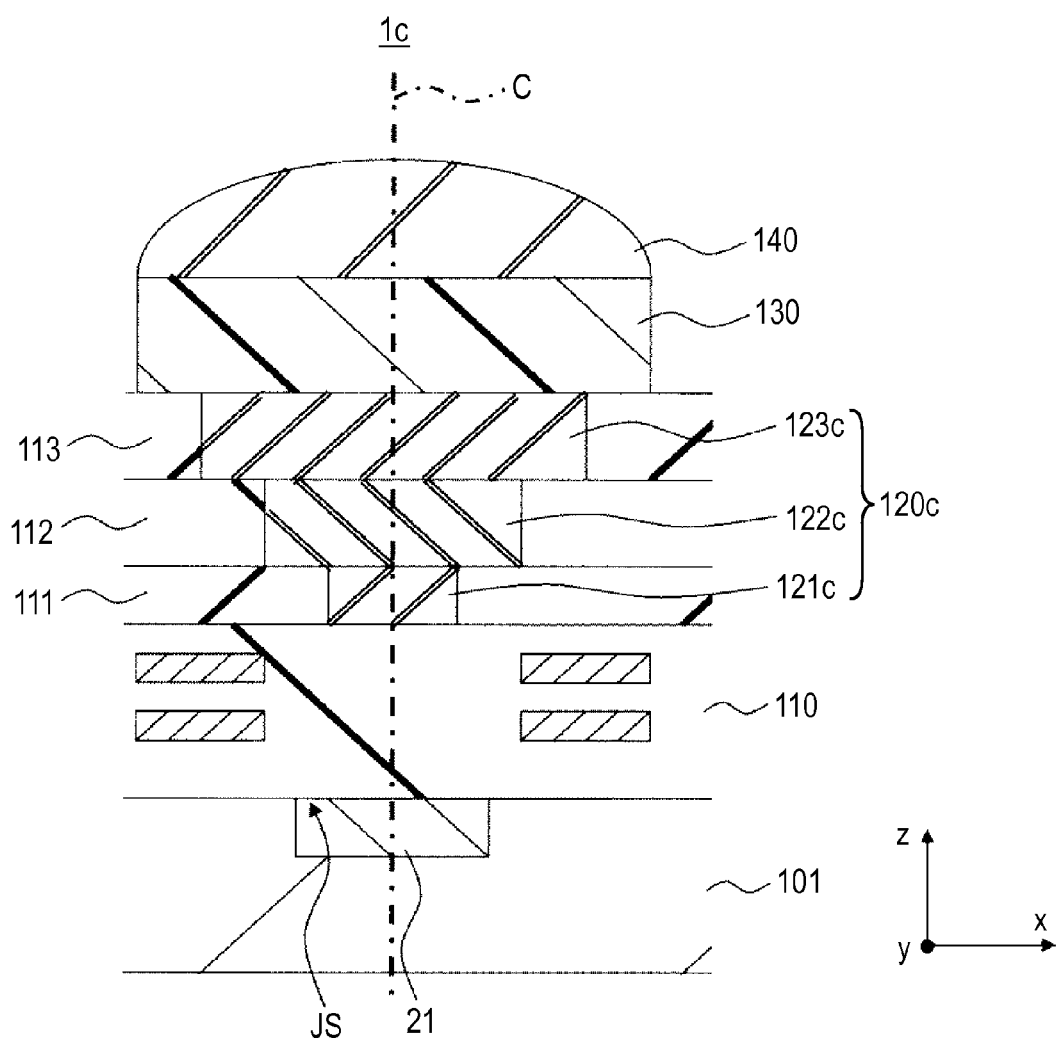
FIG. 15 is a cross-sectional view representing a major portion of a solid-state imaging device 1c according to Embodiment 3 of the present invention.
Figure 16:
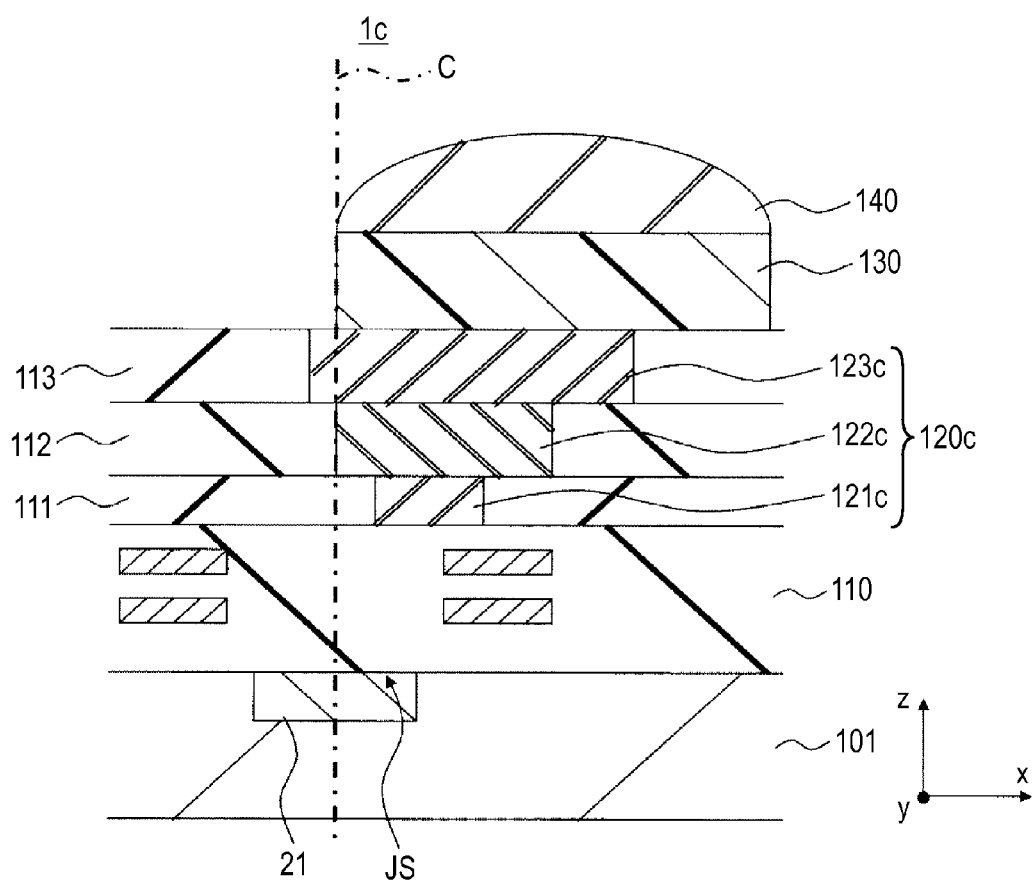
FIG. 16 is a cross-sectional view representing a major portion of a solid-state imaging device 1c according to Embodiment 3 of the present invention.

FIG. 15 and FIG. 16 are cross-sectional views representing major portions of a solid-state imaging device 1c according to Embodiment 3 of the present invention. Here, FIG. 15, similarly to FIG. 4, shows a portion of the pixel P disposed in the center portion of the image forming area PA represented in FIG. 2. On the other hand, FIG. 16, similarly to FIG. 5, shows a portion of the pixel P disposed in the peripheral portion of the image forming area PA represented in FIG. 2.

As shown in FIGS. 15 and 16, in this embodiment, an inner-layer lens 120c is different from that of Embodiment 1.

Except for this point, this embodiment is the same as Embodiment 1. Thus, description of portions common to Embodiment 1 is omitted here.

The inner-layer lens 120c, as shown in FIGS. 15 and 16, similarly to that of Embodiment 1, includes first to third lens material layers 121c, 122c, and 123c.

Although the first to third lens material layers 121c, 122c, and 123c have the same shapes as those of Embodiment 1, the configuration of optical materials used for formation of the layers is different from that of Embodiment 1.

In this embodiment, the lens material layers 121c, 122c, and 123c are formed to include portions of which the refractive indices decrease in a direction toward the photo diode 21. In other words, among a plurality of the lens material layers 121c, 122c, and 123c, the first lens material layer 121c disposed on the lowermost layer is formed by using an optical material having the lowest refractive index. In addition, among the plurality of the lens material layers 121c, 122c, and 123c, the third lens material layer 123c disposed on the uppermost layer is formed by using an optical material having the highest refractive index.

For example, the first lens material layer 121c is formed from SiON having a refractive index of 1.7. In addition, the second lens material layer 122c, for example, is formed from SiON having a refractive index of 1.85. The first lens material layer 121c and the second lens material layer 122c are formed by differently adjusting the containing ratios of [O] and [N] in using the CVD method. The third lens material layer 123c, for example, is formed from SiN having a refractive index of 2.0.

[Sum Up]

As described above, in this embodiment, the lens material layers 121c, 122c, and 123c configuring the inner-layer lens 120c are formed to have refractive indices decreasing in the direction toward the photo diode 21. In such a case, occurrence of reflection at the time of output of light from the lower surface of the inner-layer lens 120c can be prevented. Furthermore, in a case where the refractive index of the upper portion of the inner-layer lens 120c is high, a difference between the refractive indices is decreased, thereby reflection from the upper end of the lens can be suppressed.

As a result, according to this embodiment, the sensitivity can be improved, thereby the image quality of an image that is imaged can be improved.

4. Embodiment 4

Configuration of Device and Others

Figure 17:
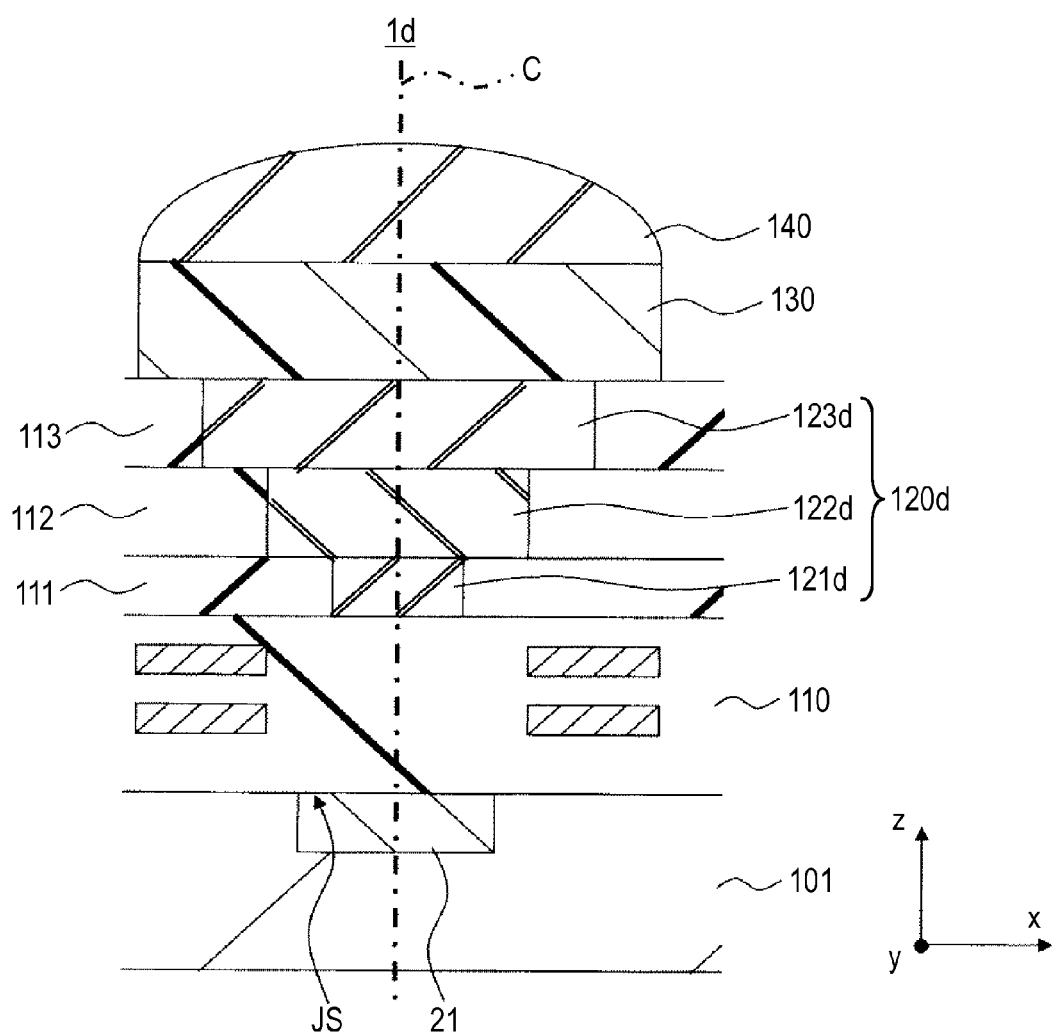
FIG. 17 is a cross-sectional view representing a major portion of a solid-state imaging device 1d according to Embodiment 4 of the present invention.
Figure 18:
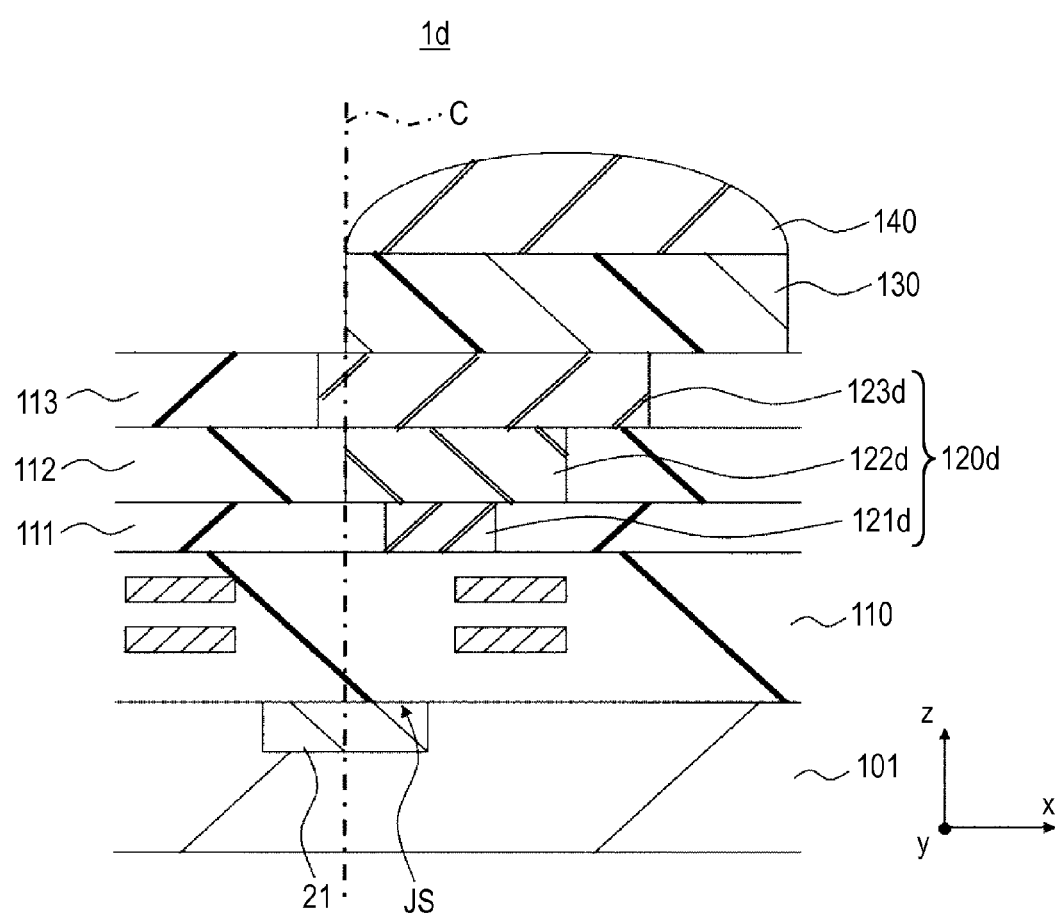
FIG. 18 is a cross-sectional view representing a major portion of a solid-state imaging device 1d according to Embodiment 4 of the present invention.

FIG. 17 and FIG. 18 are cross-sectional views representing major portions of a solid-state imaging device 1d according to Embodiment 4 of the present invention. Here, FIG. 17, similarly to FIG. 4, shows a portion of the pixel P disposed in the center portion of the image forming area PA represented in FIG. 2. On the other hand, FIG. 18, similarly to FIG. 5, shows a portion of the pixel P disposed in the peripheral portion of the image forming area PA represented in FIG. 2.

As shown in FIGS. 17 and 18, in this embodiment, an inner-layer lens 120d is different from that of Embodiment 1. Except for this point, this embodiment is the same as Embodiment 1. Thus, description of portions common to Embodiment 1 is omitted here.

The inner-layer lens 120d, as shown in FIGS. 17 and 18, similarly to that of Embodiment 1, includes first to third lens material layers 121d, 122d, and 123d.

Although the first to third lens material layers 121d, 122d, and 123d have the same shapes as those of Embodiment 1, the configuration of optical materials used for formation of the layers is different from that of Embodiment 1.

In this embodiment, the lens material layers 121d, 122d, and 123d are formed to include portions of which the refractive indices increase in a direction toward the photo diode 21. In other words, among a plurality of the lens material layers 121d, 122d, and 123d, the first lens material layer 121d disposed on the lowermost layer is formed by using an optical material having the highest refractive index. In addition, among the plurality of the lens material layers 121d, 122d, and 123d, the third lens material layer 123d disposed on the uppermost layer is formed by using an optical material having the lowest refractive index.

For example, the first lens material layer 121d is formed from SiN having a refractive index of 2.0. In addition, the second lens material layer 122d, for example, is formed from SiON having a refractive index of 1.85. The third lens material layer 123d, for example, is formed from SiON having a refractive index of 1.7. The second lens material layer 122d and the third lens material layer 123d are formed by differently adjusting the containing ratios of [O] and [N] in using the CVD method.

[Sum Up]

As described above, in this embodiment, the lens material layers 121d, 122d, and 123d configuring the inner-layer lens 120d are formed to have refractive indices increasing in the direction toward the photo diode 21. In such a case, the effective curvature of the lower surface of the inner-layer lens 120d is increased, and accordingly, the beam bending capability of this portion can be improved. Furthermore, in a case where the refractive index of the upper portion of the inner-layer lens 120d is low, a difference between the refractive indices is decreased, thereby reflection from the upper end of the lens can be suppressed.

As a result, according to this embodiment, the sensitivity can be improved, thereby the image quality of an image that is imaged can be improved.

5. Embodiment 5

Configuration of Device and Others

Figure 19:
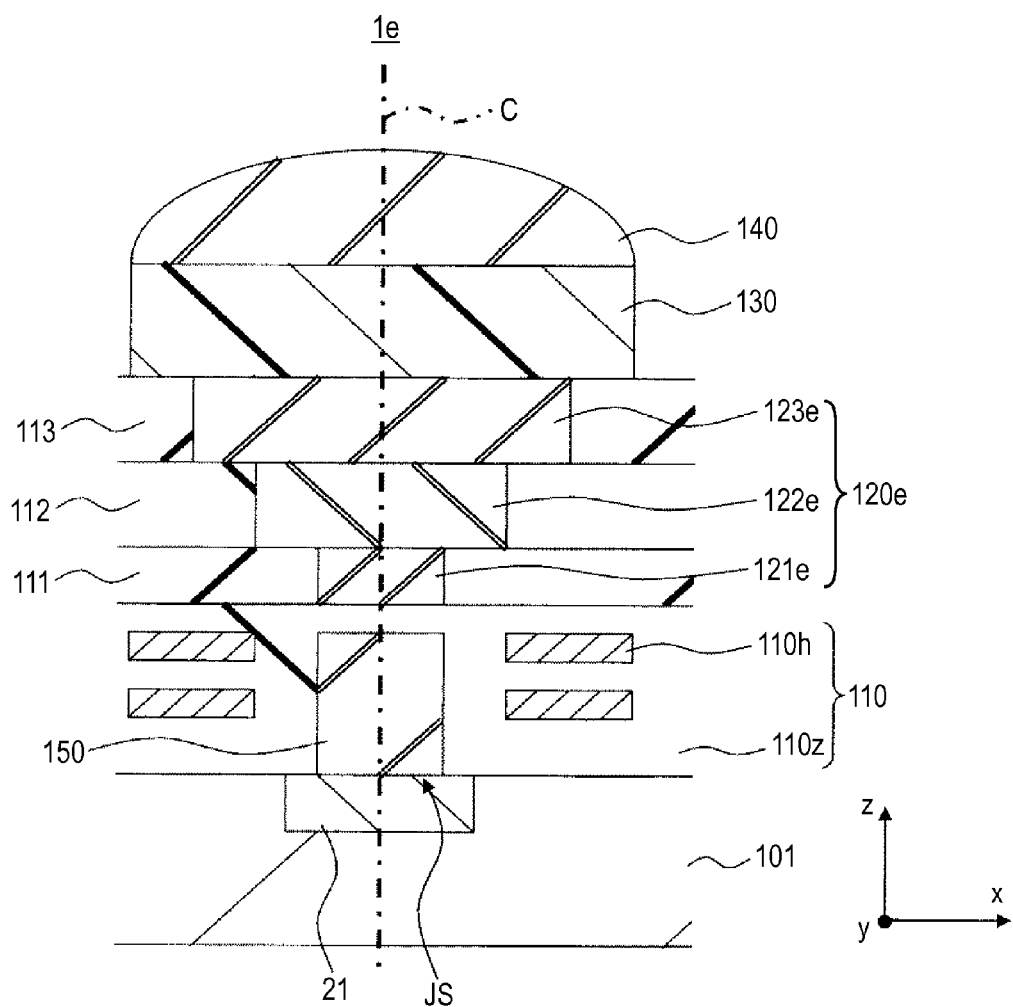
FIG. 19 is a cross-sectional view representing a major portion of a solid-state imaging device 1e according to Embodiment 5 of the present invention.
Figure 20:
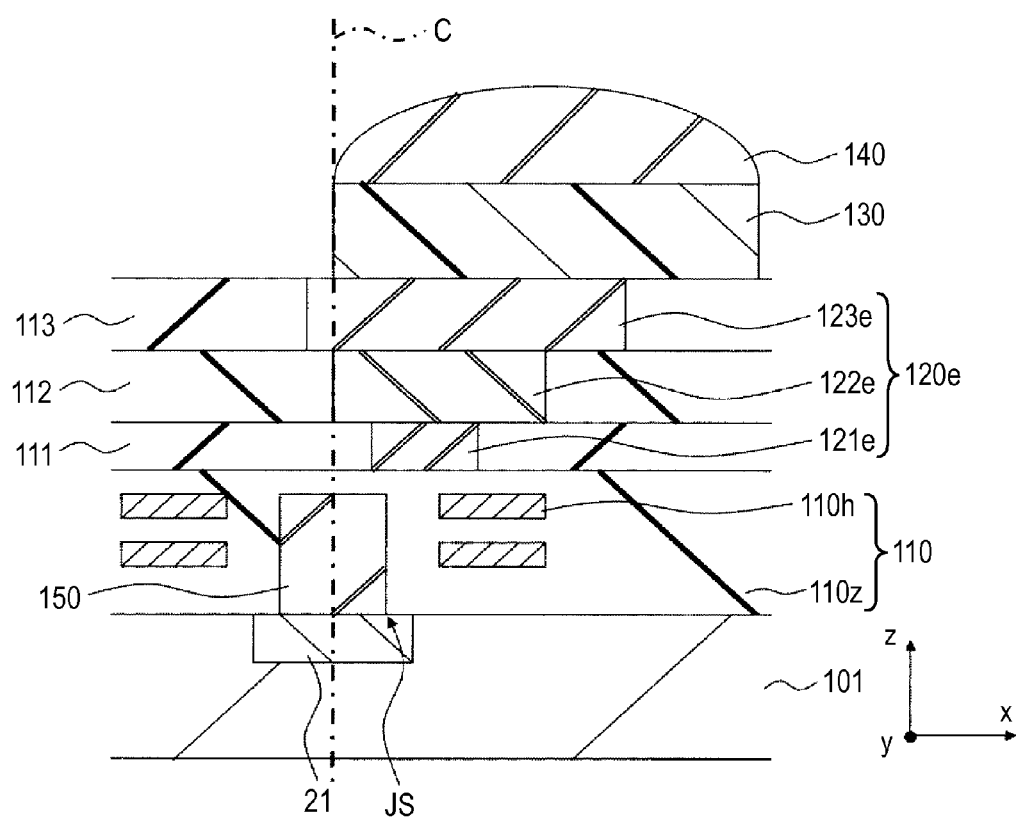
FIG. 20 is a cross-sectional view representing a major portion of a solid-state imaging device 1e according to Embodiment 5 of the present invention.

FIG. 19 and FIG. 20 are cross-sectional views representing major portions of a solid-state imaging device 1e according to Embodiment 5 of the present invention. Here, FIG. 19, similarly to FIG. 4, shows a portion of the pixel P disposed in the center portion of the image forming area PA represented in FIG. 2. On the other hand, FIG. 20, similarly to FIG. 5, shows a portion of the pixel P disposed in the peripheral portion of the image forming area PA represented in FIG. 2.

As shown in FIGS. 19 and 20, in this embodiment, an optical waveguide 150 is disposed further. Except for this point, this embodiment is the same as Embodiment 1. Thus, description of portions common to Embodiment 1 is omitted here.

The optical waveguide 150, as shown in FIGS. 19 and 20, is formed to be positioned on the photo diode 21 on the upper side of the surface of the substrate 101. The optical waveguide 150 is configured so as to guide incident light to the light reception surface JS of the photo diode 21. The optical waveguide 150, as shown in FIGS. 19 and 20, is interposed between the inner-layer lens 120 and the light reception surface JS of the photo diode 21 and is formed so as to guide the light output from the inner-layer lens 120 to the light reception surface JS of the photo diode 21.

Figure 21:
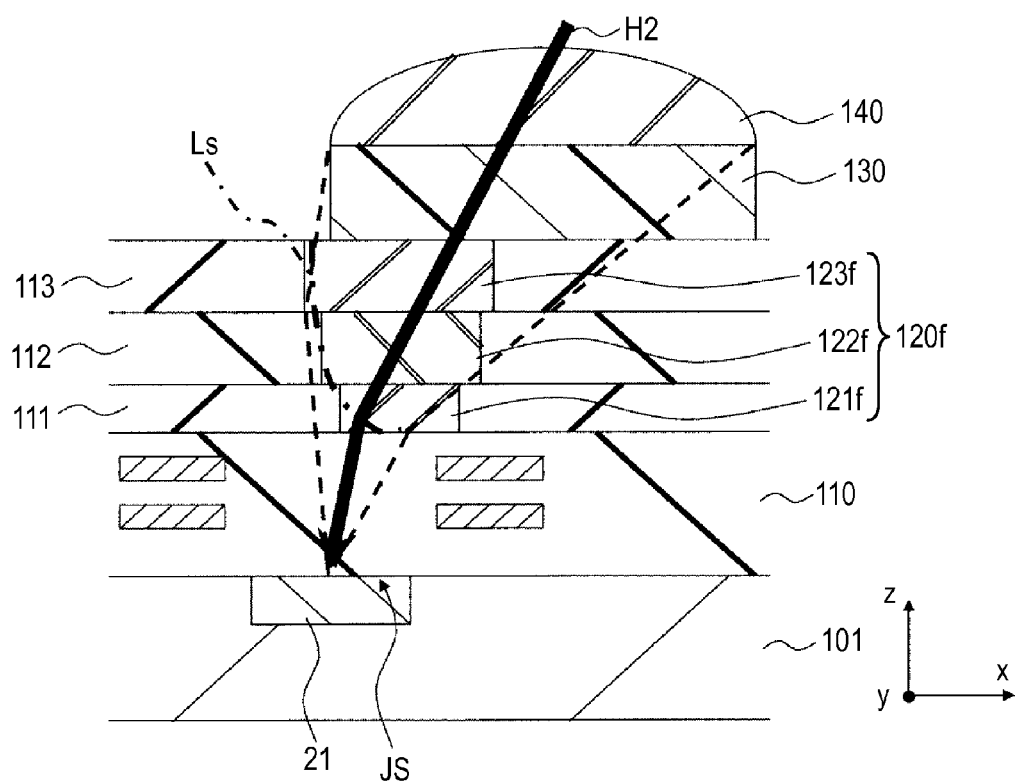
FIG. 21 is a diagram showing a major portion of a solid-state imaging device according to an embodiment of the present invention.

In particular, on the surface of the substrate 101, as shown in FIGS. 20 and 21, the wiring layer 110 is disposed. In the wiring layer 110, as described above, wirings 110h are disposed inside the insulating layer 110z, and the insulating layer 110z is formed from a light-transmissive material through which light can be transmitted. For example, the insulating layer 110z is formed from a silicon oxide film (refractive index n=1.43).

The optical waveguide 150, as shown in FIGS. 20 and 21, is disposed so as to extend to the light reception surface JS of the photo diode 21 inside the wiring layer 110. The optical waveguide 150 is formed by using an optical material that has a refractive index higher than that of the insulating layer 110z configuring the wiring layer 110. For example, the optical waveguide 150 is formed by using silicon nitride (refractive index: 2.0) that is deposited by using a plasma CDV method. In other words, the optical waveguide 150 is configured to serve as a core portion, and the insulating layer 110z is configured to serve as a clad portion.

[Sum Up]

As described above, in this embodiment, the optical waveguide 150 is formed so as to guide the incident light to the light reception surface JS of the photo diode 21.

As a result, according to this embodiment, the sensitivity can be improved, and thereby the image quality of an image that is imaged can be improved.

6. Others

The present invention is not limited to the above-described embodiments, and various modified examples can be employed.

In the above-described embodiments, a case where the embodiments are applied to a CMOS image sensor has been described. However, the present invention is not limited thereto. For example, the present invention can be applied to a CCD image sensor.

In addition, the forming of the inner-layer lens is not limited to that described in the above-described embodiments.

Figure 22:
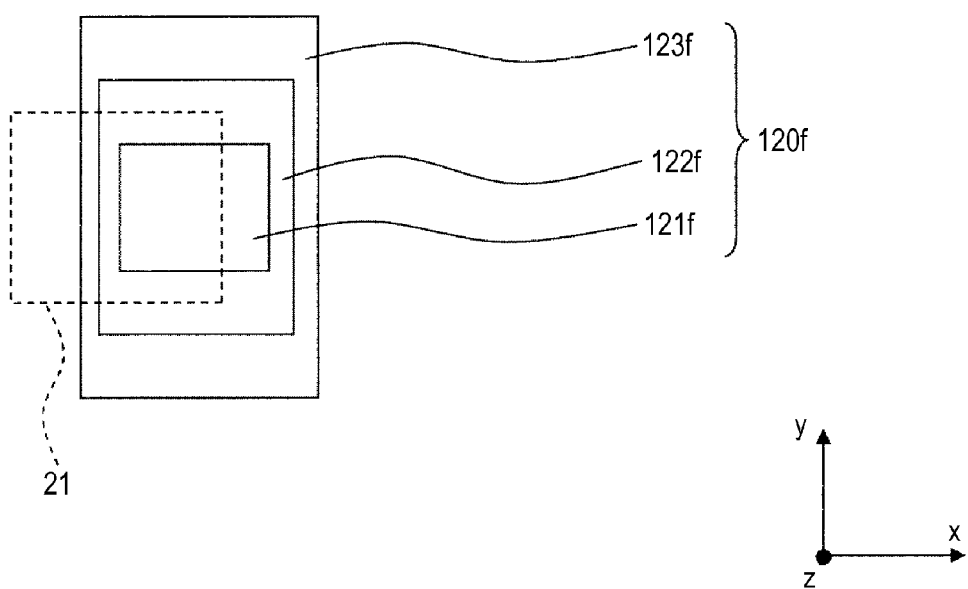
FIG. 22 is a diagram showing a major portion of a solid-state imaging device according to an embodiment of the present invention.

FIGS. 21 and 22 are diagrams showing major portions of a solid-state imaging device according to such an embodiment of the present invention. Here, FIG. 21, similarly to FIG. 5, shows a cross-section of a portion of the pixel P that is disposed in the peripheral portion of the image forming area PA represented in FIG. 2. FIG. 22 is a plan view showing the relationship between lens material layers 121f, 122f, and 123f configuring an inner-layer lens 120f and the photo diode 21 in the above-described portion.

As shown in FIG. 21, the inner-layer lens 120f, similarly to that of Embodiment 1, includes a first lens material layer 121f, a second lens material layer 122f, and a third lens material layer 123f. The layers are sequentially stacked. In addition, the lens material layers 121f, 122f, and 123f are disposed such that different levels are formed on the side face aligned along the z direction perpendicular to the light reception surface JS.

However, as shown in FIG. 21, the lens material layers 121f, 122f, and 123f are disposed so as to have the curvature of the lens surface Ls to be larger than that of Embodiment 1.

In particular, as shown in FIG. 22, gaps between the side faces (the left side in FIG. 22), which are located on the peripheral side of the image forming area PA, of the lens material layers 121f, 122f, and 123f are formed to be less than those of Embodiment 1.

Accordingly, the curvature of the lens surface Ls of a half lens, which is located on the peripheral side of the image forming area PA, of the inner-layer lens 120f may be configured to be greater than that of Embodiment 1. When the curvature of the half lens is increased, the "beam bending effect" that refracts the main light beam H2 can be improved further. As in Embodiment 1, in a case where the curvature of the half lens is less than that of the case shown in FIGS. 21 and 22, the main light beam H2 output from the on-chip lens 140 is preferably bound in a wide range. Accordingly, there is a margin for dimensional variations of the inter-layer lens. Therefore, the reliability and the yield ratio of the product can be improved.

Figure 23:
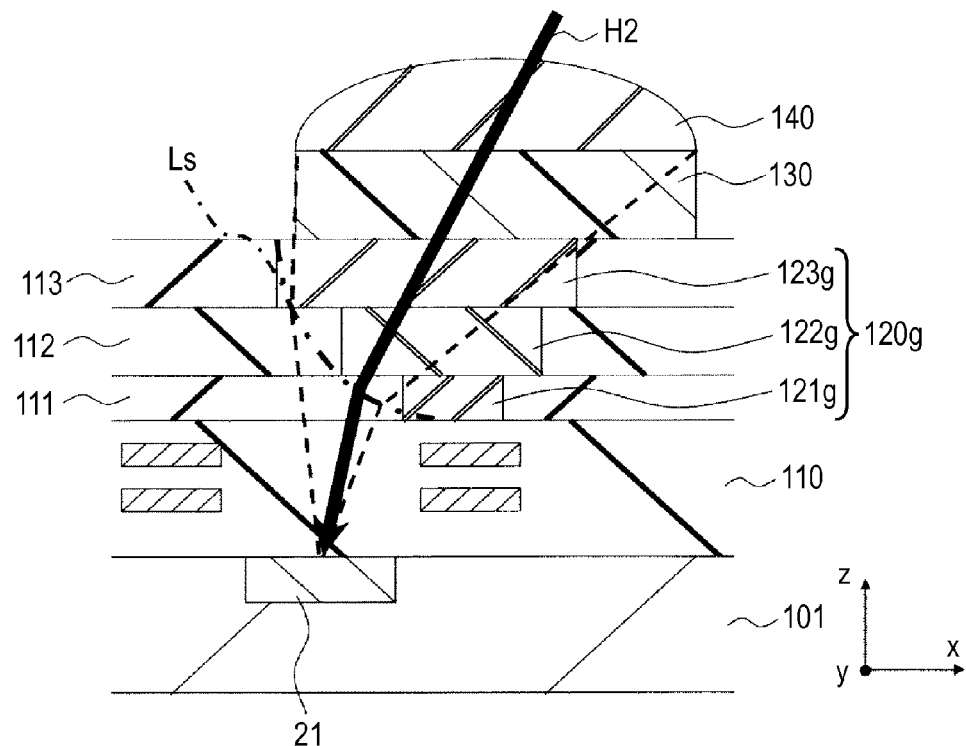
FIG. 23 is a diagram showing a major portion of a solid-state imaging device according to an embodiment of the present invention.
Figure 24:
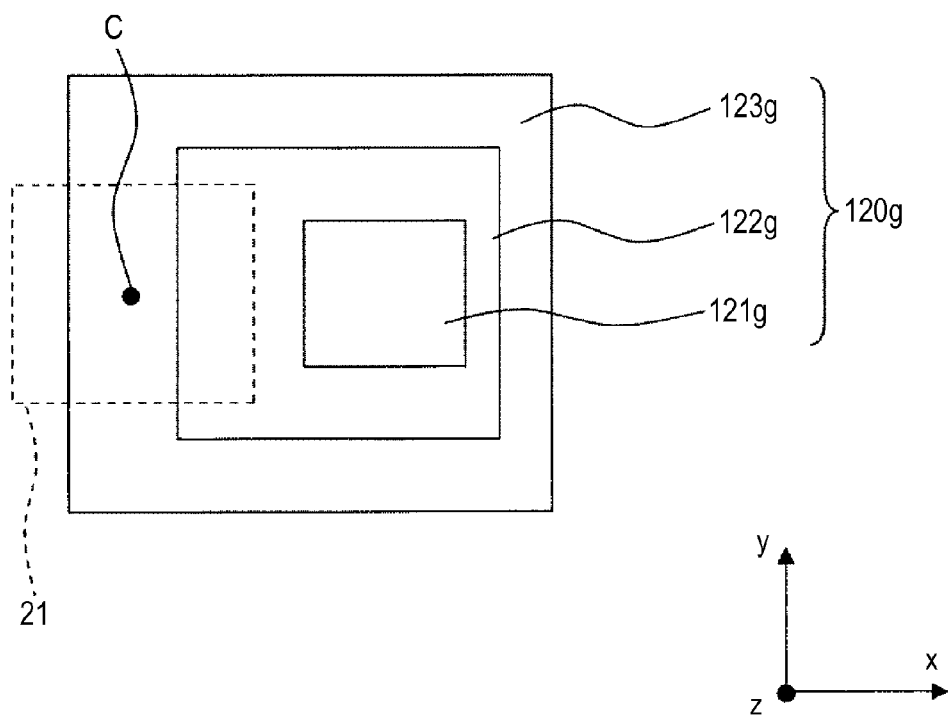
FIG. 24 is a diagram showing a major portion of a solid-state imaging device according to an embodiment of the present invention.

FIGS. 23 and 24 are diagrams showing major portions of a solid-state imaging device according to such an embodiment of the present invention. Here, FIG. 23, similarly to FIG. 5, shows a cross-section of a portion of the pixel P that is disposed in the peripheral portion of the image forming area PA represented in FIG. 2. FIG. 24 is a plan view showing the relationship between lens material layers 121g, 122g, and 123g configuring an inner-layer lens 120g and the photo diode 21 in the above-described portion.

As shown in FIG. 23, the lens material layers 121g, 122g, and 123g may be disposed such that the curvature of the lens surface Ls is less than that of Embodiment 1.

In particular, as shown in FIG. 24, gaps between the side faces (the left side in FIG. 24), which are located on the peripheral side of the image forming area PA, of the lens material layers 121g, 122g, and 123g may be formed to be greater than those of Embodiment 1.

In other words, each of the layers may be formed to be shifted, so that the pitch of the first lens material layers 121g of a lower layer is longer than that of the second lens material layers 122g of a layer located on the upper side of the lower layer, and the pitch of the third lens material layers 123g of a layer located on a further upper side is longer than that of the second lens material layers 122g.

By decreasing the curvature of the lens surface Ls as described above, the lens area is widened, thereby the focus of the on-chip lens can be loosened. In addition, the design can be performed based on the difference between the shift amounts in an easy manner.

In addition, in the above-described embodiments, a case where the inner-layer lens is formed by stacking three lens material layers has been described. However, the present invention is not limited thereto. Thus, the inner-layer lens may be formed by stacking more than 3 lens material layers. In addition, the inner-layer lens may be formed in one layer.

In addition, in the above-described embodiments, a case where the present invention is applied to a camera has been described. However, the present invention is not limited thereto. Thus, the present invention can be applied to other electronic apparatuses such as a scanner and a copier that include a solid-state imaging device.

The solid-state imaging devices 1, 1b, 1c, 1d, and 1e of the above-described embodiments correspond to a solid-state imaging device according to an embodiment of the present invention. The photo diode 21 of the above-described embodiments corresponds to a photoelectric conversion unit according to an embodiment of the present invention. In addition, the camera 40 of the above-described embodiments corresponds to an electronic apparatus according to an embodiment of the present invention. The substrate 101 of the above-described embodiments corresponds to a substrate according to an embodiment of the present invention. The inner-layer lenses 120, 120b, 120c, 120d, and 120e of the above-described embodiments correspond to an inner-layer lens according to an embodiment of the present invention. In addition, the first lens material layers 121, 121b, 121c, 121d, and 121e of the above-described embodiments correspond to a lens material layer or a first lens material layer according to an embodiment of the present invention. The second lens material layers 122, 122b, 122c, 122d, and 122e of the above-described embodiments correspond to a lens material layer or a first lens material layer according to an embodiment of the present invention. In addition, the third lens material layers 123, 123*b*, 123*c*, 123*d*, and 123*e* of the above-described embodiments correspond to a lens material layer or a second lens material layer according to an embodiment of the present invention. The color filter 130 of the above-described embodiments corresponds to a color filter according to an embodiment of the present invention. In addition, the on-chip lens 140 of the above-described embodiments corresponds to an on-chip lens according to an embodiment of the present invention. The optical waveguide 150 of the above-described embodiments corresponds to an optical waveguide according to an embodiment of the present invention. In addition, the imaging surface PS and the image forming area PA of the above-described embodiments correspond to an imaging surface according to an embodiment of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a plurality of photoelectric conversion units disposed on an imaging surface of a substrate; and
   a plurality of inner-layer lenses that are disposed in correspondence with each of the plurality of photoelectric conversion units on the upper side of the photoelectric conversion units and are formed in shapes protruding in directions toward the photoelectric conversion units,
   wherein each of the plurality of inner-layer lenses is formed to have different lens shapes in the center and in the periphery of the imaging surface,
   wherein the center of each of the plurality of inner-layer lenses is disposed so as to be shifted further to the center side of the imaging surface with respect to the center of the photoelectric conversion unit as the position of the each of the plurality of the inner-layer lenses disposed on the imaging surface is more distant from the center of the imaging surface,
   wherein the inner-layer lens is formed by stacking a plurality of lens material layers,
   wherein each of the plurality of lens material layers is formed such that a lower face of a first lens material layer that is the closest to the photoelectric conversion unit of the plurality of lens material layers has an area less than that of an upper face of a second lens material layer that is the most distant from the photoelectric conversion unit of the plurality of lens material layers, and
   wherein a cross-section of each of the plurality of lens material layers that is perpendicular to the imaging surface includes a tapered portion of which a width that is defined in a direction along the imaging surface is narrowed further in a direction toward the photoelectric conversion unit.

2. The solid-state imaging device according to claim 1, wherein each of the plurality of lens material layers is formed to have a refractive index decreasing in the direction toward the photoelectric conversion unit.

3. The solid-state imaging device according to claim 1, wherein each of the plurality of lens material layers is formed to have a refractive index increasing in the direction toward the photoelectric conversion unit.

4. A solid-state imaging device comprising:
   a plurality of photoelectric conversion units disposed on an imaging surface of a substrate; and
   a plurality of inner-layer lenses that are disposed in correspondence with each of the plurality of photoelectric conversion units on the upper side of the photoelectric conversion units and are formed in shapes protruding in directions toward the photoelectric conversion units,
   wherein each of the plurality of inner-layer lenses is formed to have different lens shapes in the center and in the periphery of the imaging surface,
   wherein the center of each of the plurality of inner-layer lenses is disposed so as to be shifted further to the center side of the imaging surface with respect to the center of the photoelectric conversion unit as the position of the each of the plurality of the inner-layer lenses disposed on the imaging surface is more distant from the center of the imaging surface,
   wherein the inner-layer lens is formed by stacking a plurality of lens material layers,
   wherein each of the plurality of lens material layers is formed such that a lower face of a first lens material layer that is the closest to the photoelectric conversion unit of the plurality of lens material layers has an area less than that of an upper face of a second lens material layer that is the most distant from the photoelectric conversion unit of the plurality of lens material layers, and
   wherein each of the plurality of lens material layers is formed to have a refractive index changing in the direction toward the photoelectric conversion unit.

* * * * *